US010985082B2

(12) United States Patent
Mitchell, Jr. et al.

(10) Patent No.: US 10,985,082 B2
(45) Date of Patent: Apr. 20, 2021

(54) APPARATUS FOR EFFICIENT HIGH-FREQUENCY COMMUNICATIONS

(71) Applicant: Akash Systems, Inc., San Francisco, CA (US)

(72) Inventors: Tyrone D. Mitchell, Jr., San Francisco, CA (US); Felix Ejeckam, San Francisco, CA (US); Daniel Francis, San Francisco, CA (US); Paul Saunier, San Francisco, CA (US); Kris Kong, San Francisco, CA (US)

(73) Assignee: Akash Systems, Inc., San Francisco, CA (US)

( * ) Notice: Subject to any disclaimer, the term of this patent is extended or adjusted under 35 U.S.C. 154(b) by 0 days.

(21) Appl. No.: 17/007,614

(22) Filed: Aug. 31, 2020

(65) Prior Publication Data

US 2020/0402974 A1  Dec. 24, 2020

Related U.S. Application Data

(63) Continuation of application No. PCT/US2019/051793, filed on Sep. 18, 2019.
(Continued)

(51) Int. Cl.
*H04B 10/50* (2013.01)
*H04B 7/185* (2006.01)
(Continued)

(52) U.S. Cl.
CPC ........... *H01L 23/3732* (2013.01); *B64G 1/10* (2013.01); *G01J 3/44* (2013.01); *H01L 27/0605* (2013.01);
(Continued)

(58) Field of Classification Search
CPC ... H04B 1/02; H04B 1/04; H04B 1/06; H04B 7/185; H04B 7/18513; H04B 7/18517;
(Continued)

(56) References Cited

U.S. PATENT DOCUMENTS 4,359,733 A   11/1982  O'Neill
5,835,530 A   11/1998  Hawkes
(Continued)

FOREIGN PATENT DOCUMENTS

WO   WO-0201808 A2    1/2002
WO   WO-2020061234 A1  3/2020

OTHER PUBLICATIONS

Co-pending U.S. Appl. No. 17/007,718, filed Aug. 31, 2020.
PCT/US19/51793 International Search Report dated Jan. 28, 2020.
U.S. Appl. No. 17/007,718 Office Action dated Jan. 14, 2021.

*Primary Examiner* — Dominic E Rego

(57) ABSTRACT

Aspects of wireless communication are described, including a radiofrequency (RF) amplifier chip, configured for transmitting or receiving data, comprising a first substrate comprising a first material and a second substrate comprising a second material that is different from the first material. The first substrate and the second substrate may be lattice-matched such that an interface region between the first substrate and the second substrate exhibits an sp3 carbon peak at about 1332 cm$^{-1}$ having a full width half maximum of no more than 5.0 cm$^{-1}$ as measured by Raman spectroscopy. In some aspects, the first substrate and said second substrate permit said chip to transmit or receive data at a transfer rate of at least 500 megabits per second and a frequency of at least 8 GHz. In some aspects, the RF amplifier chip is part of a satellite transmitter.

25 Claims, 5 Drawing Sheets

Related U.S. Application Data

(60) Provisional application No. 62/733,581, filed on Sep. 19, 2018.

(51) Int. Cl.

| | |
|---|---|
| *H01L 27/06* | (2006.01) |
| *H01L 23/373* | (2006.01) |
| *H04W 52/52* | (2009.01) |
| *H04B 1/02* | (2006.01) |
| *H04B 1/06* | (2006.01) |
| *H04B 10/564* | (2013.01) |
| *G01J 3/44* | (2006.01) |
| *H04B 1/04* | (2006.01) |
| *B64G 1/10* | (2006.01) |

(52) U.S. Cl.
CPC ........... *H01L 27/0617* (2013.01); *H04B 1/02* (2013.01); *H04B 1/04* (2013.01); *H04B 1/06* (2013.01); *H04B 7/185* (2013.01); *H04B 7/18513* (2013.01); *H04B 7/18515* (2013.01); *H04B 7/18517* (2013.01); *H04B 7/18523* (2013.01); *H04B 7/18532* (2013.01); *H04B 10/501* (2013.01); *H04B 10/564* (2013.01); *H04W 52/52* (2013.01); *H04B 2001/0491* (2013.01)

(58) Field of Classification Search
CPC ........... H04B 7/18523; H04B 7/18532; H04B 10/501; H04B 10/564; H04B 2001/0491; H04W 52/52; H01L 27/0617
See application file for complete search history.

(56) References Cited

U.S. PATENT DOCUMENTS

| | | | |
|---|---|---|---|
| 6,016,313 A | 1/2000 | Foster, Jr. et al. | |
| 7,291,381 B2* | 11/2007 | Tobita | C04B 35/83 264/437 |
| 8,576,672 B1* | 11/2013 | Peng | G11B 5/7325 369/13.14 |
| 9,099,626 B2* | 8/2015 | Ockenfuss | H01L 33/60 |
| 10,611,696 B2* | 4/2020 | Oribe | C04B 41/83 |
| 2004/0150006 A1* | 8/2004 | Aulnette | H01L 21/76259 257/200 |
| 2004/0180519 A1* | 9/2004 | Schwarzenbach | B81C 1/00047 438/514 |
| 2006/0232469 A1 | 10/2006 | Pinel et al. | |
| 2009/0120568 A1* | 5/2009 | Deguet | H01L 21/76254 156/250 |
| 2009/0267689 A1 | 10/2009 | Zupac et al. | |
| 2012/0294072 A1* | 11/2012 | Loke | H01L 45/144 365/163 |
| 2013/0035632 A1* | 2/2013 | Yu | A61K 9/0097 604/66 |
| 2013/0062656 A1* | 3/2013 | Lee | H01L 25/0753 257/99 |
| 2013/0135043 A1 | 5/2013 | Hietala et al. | |
| 2013/0140637 A1* | 6/2013 | Chang | H01L 29/0847 257/347 |
| 2013/0305519 A1* | 11/2013 | Sarajlic | B81C 1/00119 29/592.1 |
| 2014/0002187 A1 | 1/2014 | McPartlin et al. | |
| 2014/0002188 A1 | 1/2014 | Chen et al. | |
| 2014/0004853 A1 | 1/2014 | Mitchell | |
| 2014/0110722 A1* | 4/2014 | Kub | H01L 23/3732 257/77 |
| 2014/0119402 A1* | 5/2014 | Deng | B32B 37/02 374/102 |
| 2014/0158987 A1* | 6/2014 | Song | H01Q 9/0407 257/29 |
| 2017/0084450 A1 | 3/2017 | Nasser-Faili | |
| 2017/0085329 A1 | 3/2017 | Ravishankar et al. | |
| 2017/0198881 A1* | 7/2017 | McCreary, Jr. | F21K 9/61 |
| 2017/0203479 A1* | 7/2017 | Laurin | B29C 45/14811 |
| 2018/0006427 A1* | 1/2018 | Sciancalepore | H01S 5/50 |
| 2018/0269111 A1* | 9/2018 | Cheng | H01L 29/7848 |
| 2018/0367100 A1* | 12/2018 | Ejeckam | H03F 3/195 |
| 2019/0025422 A1 | 1/2019 | Edinger et al. | |
| 2020/0378372 A1 | 12/2020 | Liang et al. | |

* cited by examiner

APPARATUS FOR EFFICIENT HIGH-FREQUENCY COMMUNICATIONS

CROSS-REFERENCE

This is a continuation application of International Patent Application No. PCT/US2019/051793, filed Sep. 18, 2019, which claims the benefit of U.S. Provisional Patent Application Ser. No. 62/733,581 filed Sep. 19, 2018 which is incorporated herein by reference in its entirety.

BACKGROUND

Satellites orbiting Earth have a multiplicity of functions: broadcast of information, global positioning system, remote sensing, and scientific exploration. Satellite constellations may be in Low-Earth Orbit (LEO), in Medium Earth Orbit (MEO) or in Geostationary Orbit. Satellites have gained interest given the continually rising demand for mobile data and the projected demand for data with respect to 5G networks. Consideration has therefore been given to satellite performance.

SUMMARY

The devices and systems described herein can address at least the above, by providing improved thermal performance and linearity over conventional RF power amplifiers. For example, a gallium nitride on diamond (GaND)-based amplifier as disclosed herein may offer at least some of the following advantages over conventional microwave or millimeter amplifiers. (1) For a same baseplate temperature and chip design, aspects of the present disclosure may offer higher output power and lower thermal resistance relative to conventional solid-state amplifier technology. (2) For a same baseplate and chip size but not necessarily same chip design, aspects of the present disclosure may offer higher output power, lower thermal resistance and more efficient heat flow relative to conventional solid-state amplifier technology. (3) For a same output power and chip size, aspects of the present disclosure may offer equal output power at a lower baseplate temperature compared to conventional solid-state amplifier technology at a higher baseplate temperature. (4) For a same linear output power and chip size, aspects of the present disclosure may offer higher power added efficiency (PAE) and higher wall-plug efficiency relative to conventional technology. (5) For a same dissipated power (e.g., heat) and power flux-density (PFD) limited linear output power, aspects of the present disclosure may provide higher linearity due to a reduction in the effects of higher-order intermodulation products.

In an aspect, a chip for transmitting or receiving data is provided. The chip may comprise: a first substrate comprising a first material; and a second substrate adjacent to the first substrate, which second substrate comprises a second material that is different than the first material, wherein the second substrate is lattice-matched to the first substrate such that an interface region between the first substrate and the second substrate exhibits an sp3 carbon peak at about 1332 cm$^{-1}$ having a full width half maximum of no more than 5.0 cm$^{-1}$ as measured by Raman spectroscopy, and wherein the first substrate and the second substrate permit the chip to transmit or receive the data at a transfer rate of at least 500 megabits per second and a frequency of at least 8 GHz.

In some embodiments, the chip comprises a radiofrequency amplifier circuit. In some embodiments, the first substrate has a thermal conductivity greater than about 1000 W/mK. In some embodiments, the first substrate comprises diamond. In some embodiments, the second substrate is a semiconductor. In some embodiments, the second substrate comprises a group III-V semiconductor. In some embodiments, the second substrate comprises a material selected from the group consisting of GaN, InGaN, AlGaN, and InGaAlN. In some embodiments, the second substrate comprises silicon. In some embodiments, the interface region exhibits an sp2 carbon peak at 1550 cm$^{-1}$ having an amplitude which is no more than 20% of a height of the sp3 carbon peak after background subtraction, as measured by Raman spectroscopy. In some embodiments, the interface region exhibits the sp3 carbon peak which is greater or equal to 10% of a local background intensity. In some embodiments, the transfer rate is at least 10 gigabits per second. In some embodiments, the transfer rate is at least 12 gigabits per second. In some embodiments, the transfer rate is at least 14 gigabits per second. In some embodiments, the transfer rate is at least 100 gigabits per second. In some embodiments, the transfer rate is at least 1 terabit per second. In some embodiments, the frequency is within a range from 37.5 GHz to 300 GHz. In some embodiments, the frequency is within a range from 37.5 GHz to 40.5 GHz. In some embodiments, the chip comprises a transistor comprising the second substrate. In some embodiments, the transistor has a feature size less than 40 nanometers (nm). In some embodiments, the frequency has a bandwidth of at least 50 MHz.

In another aspect, a chip for transmitting or receiving data is provided. The chip may comprise: a first substrate comprising a first material; and a second substrate adjacent to the first substrate, which second substrate comprises a second material that is different than the first material, wherein the first substrate and the second substrate are lattice-matched such that (i) the chip outputs an effective radiated power within a range from 5 W to 42 W within an antenna gain less than 30 dBi for an input power less than or equal to 2 W in a linear regime, and (ii) the chip transmits or receives the data at a transfer rate of at least 500 megabits per second.

In another aspect, a chip for transmitting or receiving data is provided. The chip may comprise: a first substrate comprising a first material; and a second substrate adjacent to the first substrate, which second substrate comprises a second material that is different than the first material, wherein the second substrate is lattice-matched to the first substrate, to provide a thermal conductivity across the first substrate and second substrate greater than or equal to 1000 W/mK, and wherein the first substrate and the second substrate permit the chip to transmit or receive the data at a transfer rate of at least 500 megabits per second and a frequency of at least 8 GHz.

In another aspect, a chip for transmitting or receiving data is provided. The chip may comprise: a first substrate comprising a first material; and a second substrate adjacent to the first substrate, which second substrate comprises a second material that is different than the first material, wherein the second substrate is lattice-matched to the first substrate, wherein the first substrate and the second substrate are lattice-matched such that (i) the chip outputs an effective radiated power within a range from 5 W to 42 W with a carrier to noise ratio of greater than 25 dB, and (ii) the chip transmits or receives the data at a transfer rate of at least 500 megabits per second and with a bandwidth within a range of at least 50 MHz.

In another aspect, a chip for transmitting or receiving data is provided. The chip may comprise: a first substrate comprising a first material; and a second substrate adjacent to the first substrate, which second substrate comprises a second material that is different than the first material, wherein the second substrate is lattice-matched to the first substrate, wherein the first substrate and the second substrate are lattice-matched such that (i) the chip outputs an effective radiated power within a range from 5 W to 42 W with a noise power interference ratio of less than 20 dB and (ii) the chip transmits or receives the data at a transfer rate of at least 500 megabits per second and a frequency of at least 8 GHz.

In another aspect, a system for transmitting or receiving data is provided. The system may comprise: a chip comprising (i) a first substrate comprising a first material, and (ii) a second substrate adjacent to the first substrate, which second substrate comprises a second material that is different than the first material, wherein the second substrate is lattice-matched to the first substrate such that an interface region between the first substrate and the second substrate exhibits an sp3 carbon peak at about 1332 cm$^{-1}$ having a full width half maximum of no more than 5.0 cm-1 as measured by Raman spectroscopy, wherein the first substrate and the second substrate permit the chip to transmit or receive the data at a transfer rate of at least 500 megabits per second and a frequency of at least 8 GHz; and a transmitting or receiving unit operatively coupled to the chip, which transmitting or receiving unit is configured to transmit or receive the data.

In some embodiments, the chip and the transmitting or receiving unit are part of a satellite. In some embodiments, the satellite is a cubesat. In some embodiments, the satellite weighs less than 50 kilograms. In some embodiments, the system further comprises one or more additional satellites each comprising the chip and transmitting or receiving unit. In some embodiments, the transmitting or receiving unit comprises one or more antennas. In some embodiments, the transmitting or receiving unit is configured to transmit or receive the data to a remote transmitting or receiving unit. In some embodiments, the data comprises at least one of voice, audio, or video data.

In another aspect, a chip for transmitting data is provided. The chip may comprise: a semiconductor layer operatively coupled to a substrate, wherein the substrate has a thermal conductivity greater than about 1000 W/mK, wherein the thermal conductivity enables the chip to produce at least 10 W of output power with an efficiency of at least 40% and a gain of at least 30 dB, for amplifying signals and transmitting the data at a transfer rate of at least 4 gigabits per second and a frequency of at least 18 GHz.

In some embodiments, the chip comprises a radiofrequency amplifier circuit. In some embodiments, the radiofrequency amplifier circuit comprises an integrated microwave circuit or an integrated millimeter-wave circuit. In some embodiments, the substrate comprises diamond. In some embodiments, the semiconductor layer comprises a group III-V semiconductor selected from the group consisting of GaN, InGaN, AlGaN, and InGaAlN. In some embodiments, a level of interference from noise power ratio of the chip is less than or equal to 20 dB. In some embodiments, a level of interference from cross-polarization on the chip is less than or equal to 12 dB.

In another aspect, a transmission device for transmitting data is provided. The transmission device may comprise: the chip of any aspect or embodiment; and a transmitting antenna operatively coupled to the chip, wherein the chip is configured to provide the output power to the transmitting antenna for transmitting the data at the transfer rate and the frequency.

In some embodiments, the device is a satellite transmitter. In some embodiments, the satellite transmitter is configured to transmit the data at an altitude of at least 400 km. In some embodiments, the satellite transmitter is configured to transmit the data at an altitude between about 400 km and about 600 km. In some embodiments, the transmitting antenna has a diameter less than or equal to 0.5 meters. In some embodiments, the transmitting antenna has an efficiency of at least 45%. In some embodiments, the transmitting antenna has a gain of at least 36 dBi. In some embodiments, the transmission device has a pointing error of less than or equal to 1 degree. In some embodiments, the transmission device has a pointing loss of less than 2.3 or equal to dB. In some embodiments, the transmission device has an effective isotropic radiative power of at least 43 dBW.

In another aspect, a data communication link is provided. The data communication link may comprise: the transmission device of any aspect or embodiment; and a receiving device in wireless communication with the transmission device, wherein the receiving device is configured to receive the data transmitted from the transmission device.

In some embodiments, the receiving device comprises a receiving antenna having a gain of at least 65 dBi and an efficiency of at least 60%. In some embodiments, an allocated bandwidth per carrier is at least about 1200 MHz. In some embodiments, the link has a noise power of less than or equal to 114 dB. In some embodiments, the link has a signal-to-noise ratio of greater than 18 dB. In some embodiments, the link has a maximum channel data rate capacity of at least 5 gigabits per second. In some embodiments, the link has a spectral efficiency of at least 5 bps/Hz. In some embodiments, the receiving antenna of the receiving device has a diameter of at least 12 meters. In some embodiments, a power flux density received at the receiving antenna of the receiving device is at least 80 dBW/m$^2$. In some embodiments, the link is subject to a propagation loss of at least 200 dB. In some embodiments, the signals comprise a modulated carrier signal, and wherein the chip has a reduced signal distortion relative to the modulated carrier signal such that a linearity of the chip is improved. In some embodiments, the signal distortion comprises an nth-order intermodulation product. In some embodiments, the nth-order intermodulation product comprises a third order intermodulation product or a fifth order intermodulation product. In some embodiments, the linearity of the chip is associated with a ratio of (i) an output power of the modulated carrier signal to (ii) a power of the nth-order intermodulation product. In some embodiments, the ratio is at least 30 dB. In some embodiments, an operating channel temperature of the chip is less than 200° C. In some embodiments, the output power corresponds to a maximum output power in a linear operating regime of the chip. In some embodiments, the efficiency corresponds to a power added efficiency (PAE) in a linear operating regime of the chip. In some embodiments, an input power to the chip is backed off by at least 5 dB from a saturation level into a linear operating regime of the chip.

In another aspect, a chip for transmitting data is provided. The chip may comprise: a semiconductor layer operatively coupled to a substrate, wherein the substrate has a thermal conductivity greater than about 1000 W/mK, and wherein the thermal conductivity enables the chip to produce at least 5 W of output power with an efficiency of at least 40% and a gain of at least 30 dB, for amplifying signals and transmitting the data at a transfer rate of at least 300 megabits per second and a frequency of at least 40 GHz.

In some embodiments, the chip comprises a radiofrequency amplifier circuit. In some embodiments, the radiofrequency amplifier circuit comprises an integrated microwave circuit or an integrated millimeter-wave circuit. In some embodiments, substrate comprises diamond. In some embodiments, the semiconductor layer comprises a group III-V semiconductor selected from the group consisting of GaN, InGaN, AlGaN, and InGaAlN. In some embodiments, a level of interference from noise power ratio of the chip is less than or equal to about 23 dB. In some embodiments, a level of interference from cross-polarization on the chip is less than or equal to about 15 dB.

In another aspect, a transmission device for transmitting data is provided. The transmission device may comprise: the chip of any aspect or embodiment; and a transmitting antenna operatively coupled to the chip, wherein the chip is configured to provide the output power to the transmitting antenna for transmitting the data at the transfer rate and the frequency.

In some embodiments, the device is a satellite transmitter. In some embodiments, the satellite transmitter is configured to transmit the data at an altitude of at least 5000 km. In some embodiments, the satellite transmitter is configured to transmit the data at an altitude of 6000 km. In some embodiments, the transmitting antenna has a diameter less than or equal to 0.5 meters. In some embodiments, the transmitting antenna has an efficiency of at least 45%. In some embodiments, the transmitting antenna has a gain of at least 43 dBi. In some embodiments, the transmission device has a pointing error of less than or equal to 0.5 degree. In some embodiments, the transmission device has a pointing loss of less than or equal to 3 dB. In some embodiments, the transmission device has an effective isotropic radiative power of at least 47 dBW.

In another aspect, a data communication link is provided comprising the transmission device of any aspect or embodiment and a receiving device in wireless communication with the transmission device, wherein the receiving device is configured to receive the data transmitted from the transmission device.

In some embodiments, the receiving device comprises a receiving antenna having a gain of at least 72 dBi and an efficiency of at least 60%. In some embodiments, an allocated bandwidth per carrier is at least 250 MHz. In some embodiments, the link has a noise power of less than about 120 dBW. In some embodiments, the link has a signal-to-noise ratio of greater than about 8.5 dB. In some embodiments, the link has a maximum channel data rate capacity of at least 500 megabits per second. In some embodiments, the link has a spectral efficiency of at least 2.9 bps/Hz. In some embodiments, the receiving antenna of the receiving device has a diameter of at least 12 meters. In some embodiments, a power flux density at the receiving antenna of the receiving device is at least 99 dBW/m$^2$. In some embodiments, the link is subject to a propagation loss of at least 200 dB. In some embodiments, the signals comprise a modulated carrier signal, and wherein the chip has a reduced signal distortion relative to the modulated carrier signal such that a linearity of the chip is improved. Iii some embodiments, the signal distortion comprises an nth-order intermodulation product. In some embodiments, the nth-order intermodulation product comprises a third order intermodulation product or a fifth order intermodulation product. In some embodiments, the linearity of the chip is associated with a ratio of (i) an output power of the modulated carrier signal to (ii) a power of the nth-order intermodulation product. In some embodiments, the ratio is at least 30 dB. In some embodiments, an operating channel temperature of the chip is less than 200° C. In some embodiments, the output power corresponds to a maximum output power in a linear operating regime of the chip. In some embodiments, the efficiency corresponds to a power added efficiency (PAE) in a linear operating regime of the chip. In some embodiments, an input power to the chip is backed off by at least 5 dB from a saturation level into a linear operating regime of the chip.

In another aspect, a method for using a radiofrequency (RF) amplifier chip is provided. The method may comprise: providing the RF amplifier chip, the RF amplifier chip comprising a first substrate comprising a first material and a second substrate adjacent to the first substrate, which second substrate comprises a second material that is different than the first material, wherein the second substrate is lattice-matched to the first substrate such that an interface region between the first substrate and the second substrate exhibits an sp3 carbon peak at about 1332 cm$^{-1}$ having a full width half maximum of no more than 5.0 cm$^{-1}$ as measured by Raman spectroscopy, and based at least in part on the first substrate and the second substrate, transmitting data at a transfer rate of at least 500 megabits per second and a frequency of at least 8 GHz.

In another aspect, a method for using a radiofrequency (RF) amplifier chip is provided. The method may comprise providing the RF amplifier chip of any aspect or embodiment and based at least in part on the first substrate and the second substrate, transmitting data at a transfer rate of at least 500 megabits per second and a frequency of at least 8 GHz.

In another aspect, a method for using a radiofrequency (RF) amplifier chip is provided. The method may comprise: providing the RF amplifier chip, the RF amplifier chip comprising a first substrate comprising a first material and a second substrate adjacent to the first substrate, which second substrate comprises a second material that is different than the first material; and based at least in part on a lattice-matching of the first substrate and the second substrate: generating an output signal from the RF amplifier chip, the output signal comprising an effective radiated power within a range from 5 W to 42 W within an antenna gain less than 30 dBi for an input power less than or equal to 2 W in a linear regime; and transmitting data at a transfer rate of at least 500 megabits per second.

In another aspect, a method for using a radiofrequency (RF) amplifier chip is provided. The method may comprise: providing the RF amplifier chip of any aspect or embodiment; and based at least in part on a lattice-matching of the first substrate and the second substrate: generating an output signal from the RF amplifier chip, the output comprising an effective radiated power within a range from 5 W to 42 W within an antenna gain less than 30 dBi for an input power less than or equal to 2 W in a linear regime; and transmitting data at a transfer rate of at least 500 megabits per second.

In another aspect, a method for using a radiofrequency (RF) amplifier chip is provided. The method may comprise: providing the RF amplifier chip, the RF amplifier chip comprising a first substrate comprising a first material and a second substrate adjacent to the first substrate, which second substrate comprises a second material that is different than the first material, wherein the second substrate is lattice-matched to the first substrate to provide a thermal conductivity, across the first substrate and second substrate, greater than or equal to 1000 W/mK, and based at least in part on the first substrate and the second substrate, transmitting data at a transfer rate of at least 500 megabits per second and a frequency of at least 8 GHz.

In another aspect, a method for using a radiofrequency (RF) amplifier chip is provided. The method may comprise: providing the RF amplifier chip any aspect or embodiment and based at least in part on the first substrate and the second substrate, transmitting data at a transfer rate of at least 500 megabits per second and a frequency of at least 8 GHz.

In another aspect, a method for using a radiofrequency (RF) amplifier chip is provided. The method may comprise: providing the RF amplifier chip, the RF amplifier chip comprising a first substrate comprising a first material and a second substrate adjacent to the first substrate, which second substrate comprises a second material that is different than the first material; and based at least in part on a lattice-matching of the first substrate and the second substrate: (i) generating an output signal from the RF amplifier chip, wherein the signal comprises an effective radiated power within a range from 5 W to 42 W with a carrier to noise ratio of greater than 25 dB; and (ii) transmitting data at a transfer rate of at least 500 megabits per second and with a bandwidth within a range of at least 50 MHz.

In another aspect, a method for using a radiofrequency (RF) amplifier chip is provided. The method may comprise: providing the RF amplifier chip, the RF amplifier chip comprising a first substrate comprising a first material and a second substrate adjacent to the first substrate, which second substrate comprises a second material that is different than the first material; and based at least in part on a lattice-matching of the first substrate and the second substrate: (i) generating an output signal from the RF amplifier chip, wherein the signal comprises an effective radiated power within a range from 5 W to 42 W with a noise power interference ratio of less than 20 dB; and (ii) transmitting data at a transfer rate of at least 500 megabits per second and a frequency of at least 8 GHz.

In another aspect, a method for using a radiofrequency (RF) amplifier chip is provided. The method may comprise: providing the RF amplifier chip, the RF amplifier chip comprising a semiconductor layer operatively coupled to a substrate, wherein the substrate has a thermal conductivity greater than about 1000 W/mK; and generating, based at least in part on the thermal conductivity, at least 10 W of output power with an efficiency of at least 40% and a gain of at least 30 dB, for amplifying signals and transmitting data at a transfer rate of at least 4 gigabits per second and a frequency of at least 18 GHz.

In another aspect, a method for using a transmission device is provided. The method may comprise: providing the radiofrequency (RF) amplifier chip of any aspect or embodiment; providing an antenna, wherein the RF amplifier chip is operatively coupled to the antenna; and generating the output power to the antenna for transmitting the data at the transfer rate and the frequency. In some embodiments, the transmission device is the transmission device of any aspect or embodiment.

In another aspect, a method for using a radiofrequency (RF) amplifier chip is provided. The method may comprise: providing the RF amplifier chip, the RF amplifier chip comprising a semiconductor layer operatively coupled to a substrate, wherein the substrate has a thermal conductivity greater than about 1000 W/mK; and generating, based at least in part on the thermal conductivity, at least 5 W of output power with an efficiency of at least 40% and a gain of at least 30 dB, for amplifying signals and transmitting data at a transfer rate of at least 300 megabits per second and a frequency of at least 40 GHz.

In another aspect, a method for using a transmission device is provided. The method may comprise: providing the radiofrequency (RF) amplifier chip of any aspect or embodiment; providing an antenna, wherein the RF amplifier chip is operatively coupled to the antenna; and generating the output power to the antenna for transmitting the data at the transfer rate and the frequency. In some embodiments, the transmission device comprises the transmission device of any aspect or embodiment.

In another aspect, a method for transmitting data is provided. The method may comprise: providing a radiofrequency (RF) amplifier chip comprising a first substrate comprising a first material and a second substrate adjacent to the first substrate, which second substrate comprises a second material that is different than the first material, wherein the second substrate is lattice-matched to the first substrate such that an interface region between the first substrate and the second substrate exhibits an sp3 carbon peak at about 1332 $cm^{-1}$ having a full width half maximum of no more than 5.0 $cm^{-1}$ as measured by Raman spectroscopy; providing a transmitting unit, operatively coupled to the chip, which transmitting unit is configured to transmit the data; and based at least in part on the first substrate and the second substrate, transmitting data at a transfer rate of at least 500 megabits per second and a frequency of at least 8 GHz.

In another aspect, a method for receiving data is provided. The method may comprise: providing a radiofrequency (RF) amplifier chip comprising a first substrate comprising a first material and a second substrate adjacent to the first substrate, which second substrate comprises a second material that is different than the first material, wherein the second substrate is lattice-matched to the first substrate such that an interface region between the first substrate and the second substrate exhibits an sp3 carbon peak at about 1332 $cm^{-1}$ having a full width half maximum of no more than 5.0 $cm^{-1}$ as measured by Raman spectroscopy; providing a receiving unit, operatively coupled to the chip, which receiving unit is configured to receive the data; and based at least in part on the first substrate and the second substrate, receiving data at a transfer rate of at least 500 megabits per second and a frequency of at least 8 GHz.

Additional aspects and advantages of the present disclosure will become readily apparent to those skilled in this art from the following detailed description, wherein only illustrative embodiments of the present disclosure are shown and described. As will be realized, the present disclosure is capable of other and different embodiments, and its several details are capable of modifications in various obvious respects, all without departing from the disclosure. Accordingly, the drawings and description are to be regarded as illustrative in nature, and not as restrictive.

INCORPORATION BY REFERENCE

All publications, patents, and patent applications mentioned in this specification are herein incorporated by reference to the same extent as if each individual publication, patent, or patent application was specifically and individually indicated to be incorporated by reference. To the extent publications and patents or patent applications incorporated by reference contradict the disclosure contained in the specification, the specification is intended to supersede and/or take precedence over any such contradictory material.

BRIEF DESCRIPTION OF THE DRAWINGS

The novel features of the invention are set forth with particularity in the appended claims. A better understanding of the features and advantages of the present invention will be obtained by reference to the following detailed description that sets forth illustrative embodiments, in which various principles of the invention are utilized, and the accompanying drawings or figures (also "FIG." and "FIGS." herein), of which:

DETAILED DESCRIPTION

Figure 1A:
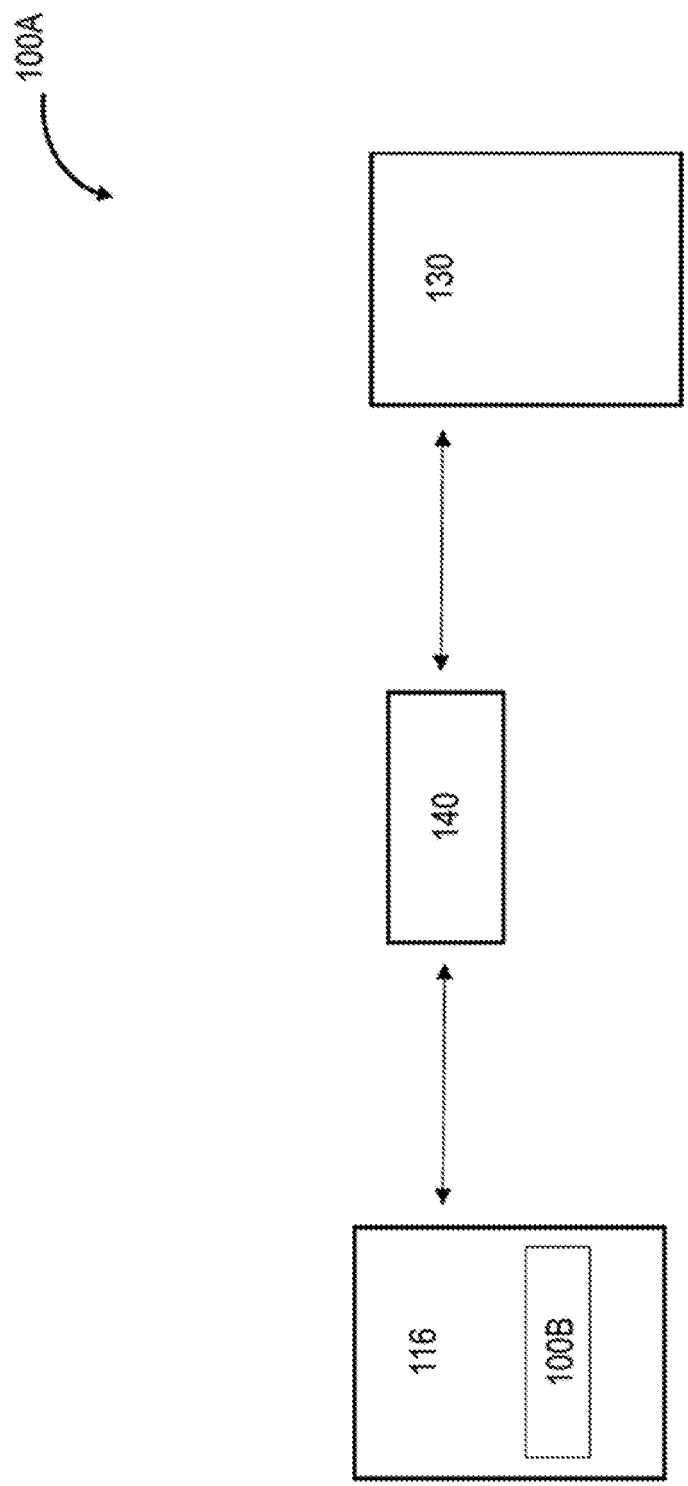
FIG. 1A illustrates a block diagram of an example communication system, in accordance with some aspects.

While various embodiments of the invention have been shown and described herein, it will be obvious to those skilled in the art that such embodiments are provided by way of example only. Numerous variations, changes, and substitutions may occur to those skilled in the art without departing from the aspects of the disclosure. It should be understood that various alternatives to the embodiments of the invention described herein may be employed. It shall be understood that different aspects of the invention can be appreciated or modified individually, collectively, or in combination with each other. Where values are described as ranges, it will be understood that such disclosure includes the disclosure of all possible sub-ranges within such ranges, as well as specific numerical values that fall within such ranges irrespective of whether a specific numerical value or specific sub-range is expressly stated.

The term "thermal budget," as used herein, generally refers to an assessment of temperature dissipation from one or more components to an environment. For example, a thermal budget may include temperature drops on each component between a heat source (e.g., active channels of an output-stage power transistor) to a surrounding environment of the system. The active layers of a semiconductor device may be several micrometers thick and may be built on top of mechanical carriers or substrates. Active layers of a semiconductor device may be formed above mechanical carriers or substrates.

The term "substrate," as used herein, generally refers to any material upon which a layered structure is deposited. The substrate may comprise a foundation for the fabrication of electronic devices, such as transistors, diodes, and integrated circuits. The substrate may comprise a solid material such as a semiconductor or an insulator. Substrate materials may comprise carbon, aluminum, gallium, silicon, germanium, arsenic, thallium, cadmium, tellurium, selenium, or alloy or allotrope thereof, or an oxide or nitride thereof. The substrate may comprise carbon (e.g., diamond) or a semiconductor, for example, gallium nitride (GaN), silicon (Si), germanium (Ge), or gallium arsenide (GaAs). The substrate may include one or more chemical dopants, such as nitrogen, phosphorous, boron or indium. Substrate materials may comprise, for example, diamond, synthetic diamond, silicon, silicon dioxide, silicon carbide, aluminum oxide, sapphire, aluminum nitride, germanium, gallium arsenide, gallium nitride or indium phosphide. The substrate material may be single crystalline, poly crystalline, or amorphous.

The term "single-crystal," as used herein may refer to a material having one crystal or having a translational symmetry. The term "polycrystalline" generally refers to a material having more than one crystal domain or orientation. A polycrystalline material may exhibit more than one crystal structure under low energy electron diffraction (LEED) microscopy. The term "amorphous" generally refers to a material having no real or apparent crystalline form. An amorphous material may not exhibit any long-range crystal structure under LEED.

The term "wide-bandgap" and "wide-gap" (or variations thereof), as used herein in the context of semiconductor technology, generally refer to electronic and/or optoelectronic devices and manufacturing technologies based on wide-bandgap semiconductors. A wide-bandgap semiconductor may have a bandgap in a range of 2-4 electronvolt (eV), for example. A wide-bandgap semiconductor can comprise, for example: (a) semiconductors comprising a bond between nitrogen (N) and at least one Group III element from the Periodic Table of the Elements (e.g., boron, aluminum, gallium, indium, and thallium), (b) semiconductors comprising a bond between carbon (C) and at least one Group IV element from the Periodic Table of the Elements (e.g., carbon, silicon, germanium, tin, and lead), or (c) semiconductors comprising a bond between oxygen (O) and at least one Group II element from the Periodic Table of the Elements (e.g., beryllium, magnesium, calcium, zinc, cadmium).

Active layers of a semiconductor device may be epitaxially grown on a substrate. In some cases, the substrate (e.g., single-crystal substrate) may be of the same family of materials as the active layers of the electronic device, for example, GaAs microwave devices on GaAs substrates, AlGaN/GaN devices on gallium nitride, sapphire, silicon and/or SiC substrates. Electronic materials for device fabrication may be realized by attaching the active layers to substrates comprising materials having crystalline structures and material combinations different from the active layer. Examples of ways to attach semiconductors with different crystal structures to other substrates can include direct-bonding and direct growth. Direct growth can include using a transition layers to bridge different lattice structures (e.g., GaN layers grown directly on Si or SiC substrates). Some examples may include attaching devices (e.g., AlGaN/GaN high-electron mobility transistors (HEMTs)) to diamond substrates. Some examples may include direct growth of diamond on semiconductors (e.g., direct growth of diamond on GaN).

The substrate may have various functions, including but not limited to (i) mechanical support; (ii) electrical conductivity that can be used to connect the active layers to the bottom of the chip; (iii) electrical isolation with low dielectric losses that can be used in high-frequency devices and surface waveguides where electric fields penetrate into the substrate; and (iv) high thermal conductivity with or without associated electrical conductivity.

The term "layered structure," as used herein, generally refers to structures created from layered materials of varying properties. A layered structure may comprise layers of one or more materials that may have the same or varying semiconductor properties. Individual layers may be single crystalline, polycrystalline or amorphous. Electronic and optoelectronic devices manufactured out of layers of different semiconductor properties may be made by different growth techniques. In some cases, these growth techniques may allow for controlled growth of individual layers. In some cases, the layers may be referred to as "epitaxial layers" or "epilayers." Each layer may be of a thickness varying from sub-nanometer to tens of microns. Non-limiting examples of manufacturing techniques include molecular beam epitaxy (MBE), vapor deposition (e.g., chemical vapor deposition (CVD), physical vapor deposition), atomic layer deposition (ALD), organo-metallic vapor-phase epitaxy, and liquid phase epitaxy. Epitaxial layers may comprise boron, aluminum, gallium, indium, thallium, carbon, silicon, germanium, tin, lead, nitrogen, phosphorous, arsenic, antimony, bismuth, oxygen, sulfur, selenium, tellurium, beryllium, magnesium, calcium, zinc, cadmium, and alloys and allotropes thereof. In some aspects of the present disclosure, epitaxial layers may comprise wide-bandgap semiconductor materials as described above. Epitaxial layers may comprise gallium nitride (GaN), aluminum nitride (AlN), indium nitride (InN), aluminum gallium nitride (AlGaN), indium gallium nitride (InGaN), indium aluminum nitride (InAlN), zinc oxide (ZnO), silicon carbide (SiC), and diamond. Any such materials may be single-crystalline, polycrystalline, or amorphous.

The term "chip," as used herein generally refers to an active electronic and/or optical device disposed on a substrate. As used herein, a chip may comprise an active device (or layer(s)) and a substrate. The active electronic or optical device may comprise a layered structure. The chip may comprise one or more transistors. The one or more transistors may comprise one or more high-electron-mobility transistors. The chip may comprise an integrated circuit. In some examples, the chip may perform functions such as mixing, power amplification, low noise amplification, and switching. In some examples, the chip may comprise a monolithic microwave integrated circuit (MMIC).

The term "transistor," as used herein, generally refers to an electrical device which can act as a switch and/or an amplifier. A transistor may be a part of a digital circuit. A digital circuit may comprise a plurality of transistors. A transistor may comprise a layered structure as described elsewhere herein. A transistor may be a part of a computing device. A transistor may be a portion of a logic circuit or a logic gate. A transistor may be a semiconductor device. The term "field-effect transistor" as used herein, generally refers to a transistor which uses an electric field to control the operation of a device having the transistor. An electric field may be used to control the flow of current between two contacts or terminals in the device such as a source contact and a drain contact.

The term "high-electron-mobility transistor" (HEMT), as used herein, generally refers to a field-effect transistor comprising a heterojunction. A heterojunction may refer to the interface between any two solid-state materials of differing material properties. In some examples, these may include any two semiconductors, any two crystalline forms (e.g., amorphous, polycrystalline) of the same semiconductor, any two semiconductors comprising the same element but with varying amounts of those elements, any two semiconductors with varying dopant level, etc. The two materials may have unequal band gaps. The two materials may have a band offset. The two materials forming the heterojuction may be referred to as a "heterostructure." In some examples, an interface between a buffer layer and a barrier layer of a HEMT may form a heterojunction.

The term "interface," as used herein, generally refers to a surface forming a common boundary between two different materials, for example, materials having different crystalline structures, differing material combinations or, differing material properties. The term "interface" can refer to a location where two different materials come into contact with one another. The term "interface" can also refer to the atoms of a first material combining with the atoms of a second material at a location or at a boundary, for example, without the presence of atoms of a third material.

In some examples, an interface may be a surface forming a common boundary between a semiconductor (e.g., wide-bandgap semiconductor) and diamond (e.g., synthetic diamond). In some aspects, an interface may be a boundary between GaN and diamond. In some examples, an interface can be a location where diamond atoms come into contact with atoms of a wide-bandgap semiconductor material (e.g., GaN). A substrate comprising at least two different materials may include a single interface (e.g., surface forming a boundary between the two materials). In some examples, a substrate may not include more than one interface.

The term "nucleation layer" or "nucleating layer," as used herein in the context of material deposition or crystal growth, generally refers to a layer that assists in starting the growth or formation of another layer of material or stoichiometry. Nucleating layer materials can include, for example, silicon nitride (SiN), silicon carbide (SiC) or other amorphous or polycrystalline materials that may aid in the nucleation of synthetic diamond (e.g., silicon or other wide-bandgap semiconductor materials) and can help prevent etching or damage to an underlying semiconductor.

Wide-bandgap semiconductor materials, such as group III-V semiconductors, may be useful in the design of microwave transistors for efficient and high-power applications. For example, semiconductor compounds including GaN, indium gallium nitride (InGaN), aluminum gallium nitride (AlGaN), indium gallium aluminum nitride (InGaAlN), gallium oxide (Ga2O3), aluminum nitride (AlN), indium aluminum nitride (InAlN)) have shown to improve performance and efficiency in high-power microwave device designs. Such high-power microwave devices can exhibit electron mobilities, breakdown voltages, and thermal conductivities that exceed other semiconductor materials such as gallium arsenide (GaAs), indium phosphide (InP), or silicon.

Conventional heat removal systems for transistors, light-emitting devices, and other semiconductor devices (e.g., integrated microwave circuits, microwave amplifiers) are typically large in comparison with a heat source in such devices and can limit thermal and overall performance. Because of the superior thermal properties of diamond, diamond heat-sinks, diamond heat-spreaders, and other diamond plates are useful in spreading heat below a semiconductor device for thermal management. In some cases, diamond substrates may differ from diamond heat-sinks (or heat-spreaders or plates). For example, a diamond substrate may comprise a substrate on which active electronic device layers are disposed to form a device (e.g., a chip, a radiofrequency (RF) amplifier chip, microwave amplifier chip). In some cases, the diamond heat-sink may be a thermal component to which a device can be attached, wherein the diamond heat-sink assists in spreading heat generated by the device.

Some aspects of the present disclosure are directed to the design and manufacturing of a thermally efficient RF power amplifier (e.g., RF amplifier chip comprising an RF power amplifier). A thermally efficient RF power amplifier may have improved linearity for use in various applications. Such applications may include wireless communications. Some applications include satellite communications. Some applications include cellular and/or non-cellular wireless communications. RF power amplifiers of the present disclosure may be used for downstream communication between satellites and ground stations and/or between satellites. Satellites may communicate in a wide range of frequencies and communications bands. In some examples, amplifiers of the present disclosure may operate in an L-band frequency range (e.g., 1-2 GHz), S-band frequency range (e.g., 2-4 GHz), C-band frequency range (e.g., 4-8 GHz), X-band frequency range (e.g., 8-12 GHz), K-band frequency range (e.g., 17-20 GHz (Ku/K-bands), 37-40 GHz (Ka-bands)), a V-band frequency range (e.g., 40-75 GHz), W-band frequency range (e.g., 75-110 GHz), mm-wave band frequency range, G-band frequency range (e.g., 110-300 GHz), E-band frequency range (e.g., 60-90 GHz), or any suitable frequency ranges.

In some aspects, the present disclosure provides an RF amplifier chip. The RF amplifier chip may comprise aspects similar to chip 100B of FIG. 1B. In some aspects, the RF amplifier chip comprises semiconductor epilayers disposed on a thermally conductive substrate and operatively configured for providing (e.g., configured to output or emit) an amplified microwave signal with 3-dB-gain-compressed output power when a signal of first input power is amplified. The semiconductor epilayers may be wide-bandgap semiconductor epilayers (e.g., GaN, AlN, InGaN, InAlN, AlGaN, InGaAlN, Ga2O3 and derivatives of AlGaN). The RF amplifier chip may be part of a transmitter, for example, part of a transmitter for satellite communications.

The thermally conductive substrate may comprise synthetic diamond and the epilayers (e.g., AlGaN epilayers) may be disposed on the synthetic diamond substrate and operatively configured for providing (e.g., configured to output or emit) an amplified microwave signal with 3-dB-gain-compressed output power when a signal of first input power is amplified. The RF amplifier chip may be configured for providing an amplified microwave signal having a linear output power when a signal of second input power is amplified, and when a third-order intermodulation product having a third power at least 50 dB lower than the linear output power when the second input power is equal to the first input power reduced by 6 decibels (dB). The power added efficiency (PAE) of the amplifier chip may be at least 50%, for example, when the chip is operated at the second input power. The PAE may be determined based at least in part on measurements taken at the output of an amplifier chip. The first input power may be associated with a saturated output power at which the gain curve has reduced by 3 dB relative to the maximum output power in a linear operating regime. The saturated output power may be referred to as a P3 dB output level. The second input power may be associated with the maximum output power in a linear operating regime.

Systems and methods of the present disclosure may offer improved thermal performance of the RF amplifier chip. In some examples, a chip (e.g., the RF amplifier chip) may comprise, or be part of, a device such as a package and the package may be disposed on a package base. Some aspects provide improved heat flow from the package to the package base. Some aspects provide improved heat flow from an active area of a transistor (e.g., active layer of the semiconductor epilayers) to the package base. Some aspects provide for heat flow from the package base and to a radiant element (e.g., radiant cooling element). Such radiant cooling element may be part of a satellite. Diamond substrates can improve heat flow (e.g., relative to substrates that do not include diamond) and improved heat flow may contribute to an increase in transistor gate packing densities and amplifier output power. Microwave amplifiers that include the disclosed GaN-on-Diamond (GaND) technology disclosed herein may have PAEs at least 20% to 30% higher than microwave amplifiers that do not include such GaND technology.

In some cases, heat dissipation may be more pronounced in small electronic devices, such as RF power amplifiers, in which the device lateral dimensions can be on the order of the substrate thickness or greater. For example, high-electron mobility AlGaN/GaN transistors operating in the Ku-band may be designed with unit gate widths of 100 μm or shorter to meet microwave performance. In such devices, the improvement in thermal performance by using diamond substrates rather than conventional substrates may be significant. For example, high-power AlGaN/GaN field-effect transistors using diamond substrates rather than sapphire, silicon, or SiC substrates can reduce thermal resistance of the device. As a result of reduced thermal resistance, diamond substrates may increase the energy efficiency and thus the output RF power capability of an amplifier. In some examples, the linearity of the amplifier disclosed herein for a given power may be improved compared to conventional amplifiers. In some cases, the saturated output power from the disclosed amplifiers (e.g., GaND-based amplifiers) may be at least double that of similarly sized conventional amplifiers.

FIG. 1A illustrates a block diagram of an example communication system 100, in accordance with some aspects. The example communication system 100 may comprise a transmitter 116 and a receiver 130. The transmitter 116 may comprise a chip, such as an RF amplifier chip. The chip may be designed and fabricated in accordance with various aspects described herein and may be, for example, comprise aspects similar to chip 100B as described with respect to FIG. 1B. The transmitter 116 may comprise an amplifier, such as an RF amplifier.

The transmitter 116 and the receiver 130 may be terrestrial or aerial devices (e.g., units) and may be stationary (e.g., earth station, terminal, gateway) or mobile (e.g., vehicular, aerial or mobile client devices). Non-limiting examples of stationary devices include, for example, ground stations (e.g., earth station, terminal, gateway) or land stations (e.g., base station, node, access point). Non-limiting examples of mobile devices include, for example, vehicular devices, aerial devices or mobile client devices.

The transmitter 116 may be configured for transmitting electromagnetic signals to the receiver 130. The receiver 130 may be configured for receiving electromagnetic signals from the transmitter 116. Transmitter 116 may be an RF or microwave transmitter, including transmitting circuitry configured to be communicatively coupled to one or more antennas for transmitting RF or microwave signals over link 140 to the receiver 130. Receiver 130 may be an RF or microwave receiver, including receiving circuitry configured to be communicatively coupled to one or more antennas for receiving RF or microwave signals over link 140 from the transmitter 116. The transmitter 116 and the receiver 130 may also include circuitry configured for both transmitting and receiving functions (e.g., transceiver functions).

An antenna may comprise, for example, an antenna array such as a phased array antenna (e.g., configured for beamforming). The transmitter 116 may comprise a plurality of transmit elements (e.g., an array of transmit elements) and one or a plurality of transmit elements may be communicatively coupled to an antenna element. The receiver 130 may also comprise a plurality of receiver elements, wherein a receiver element or a plurality of receiver elements may be communicatively coupled to an antenna element. The transmitter 116 and the receiver 130 may be connected communicatively coupled, and configured to communicate wirelessly, via link 140. The link 140 may comprise electromagnetic transmissions between the transmitter 116 and the receiver 130. The link 140 may be characterized by parameters including propagation loss (e.g., pathloss) due to, for example, atmospheric absorption of the electromagnetic signal or multipath fading.

In some aspects, the wireless communication system 100 may be a satellite communication system. Transmitter 116, receiver 130, or both may be a satellite, such as a cubesat or a microsat, or may be part of such a satellite. The receiver may be terrestrial, such as an Earth station, or may be aerial, such as another satellite. In some examples, the transmitter 116 may comprise a satellite comprising an amplifier chip. The amplifier chip may comprise aspects similar to chip 100B of FIG. 1B. The satellite may be configured to wirelessly communicate with a station (e.g., Earth station) or another satellite, such as another satellite comprising a receiver (e.g., receiver 130). In some examples, satellite communication may be possible between two or more satellites. Satellite communication may be possible between a satellite and multiplicity of stations, or a multiplicity of satellites, which may be configured as network. A satellite (e.g., satellite transmitter or receiver) may be one of a plurality of satellites (e.g., a flock). The flock may be networked and, in some aspects, a satellite may be configured to operate independently of the flock.

A satellite may be part of a satellite constellation, for example, a Low Earth Orbit (LEO) satellite constellation or a Medium Earth orbit (MEO) satellite constellation. In some aspects, the satellite may be configured to transmit (e.g., receiver may be configured to receive) wireless signals at any frequency from L-band (e.g., 1-2 GHz) to millimeter-wave frequency bands including G-band (e.g., 300 GHz). In some aspects, the satellite may be configured to transmit (e.g., receiver may be configured to receive) wireless signals at any frequency within an L-band frequency range (e.g., 1-2 GHz), S-band frequency range (e.g., 2-4 GHz), C-band frequency range (e.g., 4-8 GHz), X-band frequency range (e.g., 8-12 GHz), K-band frequency range (e.g., 17-20 GHz (Ku/K-bands), 37-40 GHz (Ka-bands)), a V-band frequency range (e.g., 40-75 GHz), W-band frequency range (e.g., 75-110 GHz), mm-wave band frequency range, G-band frequency range (e.g., 110-300 GHz), E-band frequency range (e.g., 60-90 GHz), or any suitable frequency ranges. In some aspects, the satellite communication system may be configured for cellular backhaul communications. For example, one or more satellites may transmit wireless cellular backhaul signals to a base station (e.g., node, access point). In other examples, a satellite may transmit wireless signals to a mobile or aerial station, such as an aircraft (e.g., for providing aerial satellite internet).

In some examples, it may be desirable to increase downstream data rates of a wireless communication system, decrease physical payload weights, and decrease dissipated power (e.g., decreasing thermal loss). For example, in satellite applications, satellite weight, energy consumption and output, and thermal budget may be significant design considerations for achieving any one of such performance characteristics. A satellite in orbit, for example, in low earth orbit (LEO) or medium earth orbit (MEO), may take several-minutes to deliver an information payload to a station (e.g., Earth station). The time duration for delivery of the information payload may be limited, at least in part, by the length of a line-of-sight distance to the Earth-based receiver station. The duration of the electromagnetic visibility of the satellite and the distance between the satellite and the Earth station may vary as the satellite travels across the sky (e.g., quantified with elevation angle; 0° at horizon and 90° at zenith), and consequently signal strength and noise level captured by a receiver antenna at the Earth station may vary in time. In some examples, antenna efficiency (e.g., satellite antenna efficiency) may depend on pointing accuracy. High-efficiency satellite antennas (e.g., with gains over 30 dBi) may point to an Earth station accurately. In some cases, Earth-coverage antennas, which may not move relative to the satellite body, may exhibit significantly lower efficiencies, such as low-gain antennas (e.g., ranging from 5 dBi to 12 dBi).

Figure 1B:
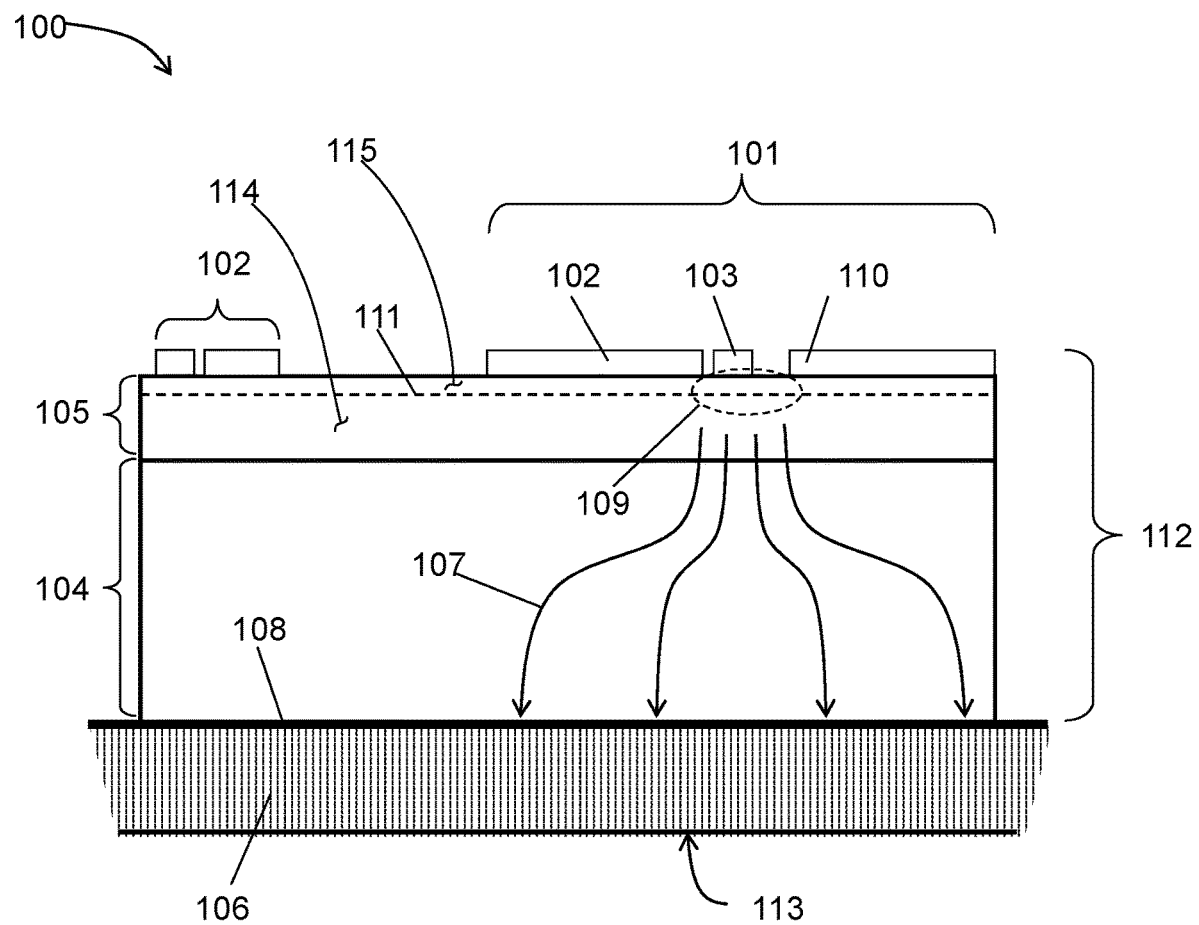
FIG. 1B illustrates a block diagram of an example chip, in accordance with some aspects.

FIG. 1B illustrates a block diagram of an example chip, in accordance with some aspects. In some aspects, the chip 100B may comprise a monolithic integrated microwave or millimeter-wave circuit (MMIC). The chip 100B may be a packaged MMIC chip. The chip 100B may be part of a power amplifier. The chip 100B may comprise a layered structure 112, which may comprise one or more layers 105 disposed on a substrate 104. The chip 100B may comprise the layered structure 112 disposed on (e.g., mounted on, attached to) a package base 106. In some cases, the substrate 104 may be attached to the package base 106 using a solder layer 108. The substrate 104 may be a high thermal conductivity substrate, for example a diamond substrate (e.g., synthetic diamond substrate).

The layered structure 112 may comprise electrical connections. The electrical connections may comprise passive circuits 102 and active circuits 101 disposed on, or as part of, the one or more layers 105. In some cases, an active circuit may comprise electrical contacts 102, 103, and 110. The chip 100B may comprise a transistor. The transistor may be, for example, a high-electron mobility transistor (HEMT) or heterostructure field-effect transistor (HFET). The electrical contacts may comprise a source 102, gate 103, and drain 110 terminals. The source 102, gate 103, and drain 110 terminals may be disposed the one or more layers 105. The one or more layers may comprise a two-dimensional electron gas layer (2DEG) or channel 111. The 2DEG layer 111 may be embedded within the one or more layers 105 (e.g., disposed on the substrate 104). The transistor may operate by using a voltage applied between the gate 103 and the source 102 to control current flowing along the 2DEG 111 between the source 102 and the drain 110.

The region of the 2DEG 111 where the gate voltage controls the current may be disposed below the gate 103 terminal. One or more layers may be disposed proximal to the 2DEG 111, for example, above or below the 2DEG 111. In some aspects, layer(s) disposed above the 2DEG 111 may be referred to as a barrier layer 115 and layer(s) disposed below the 2DEG 111 may be referred to as a buffer layer 114. The barrier layer 115 and the buffer layer 114 may comprise a heterojunction. The barrier layer 115 and the buffer layer 114 may be a part of an epilayer. The epilayer may be referred to interchangeably as the one or more layers 105. The barrier layer 115 and the buffer layer 114 may comprise a heterostructure. The barrier layer 115 and the buffer layer 114 may have unequal band gaps. The barrier layer 115 and the buffer layer 114 may have a band offset. An interface between one or more buffer layer(s) (e.g., buffer layer 114) and one or more barrier layer(s) (e.g., barrier layer 115) may comprise a two-dimensional electron gas (2DEG) layer (e.g., 2DEG layer 111). The 2DEG layer 111 may be proximal to the interface between the barrier layer and the buffer layer.

In some cases, the width of the 2DEG layer 111 may be controlled through the application of a voltage. The width of the 2DEG layer 111 may be less than 50 nanometers, less than 10 nanometers, less than 5 nanometers or less. In some examples, the 2DEG layer 111 may be no further than 150 nanometers from the high thermal conductivity substrate. In some cases, the 2DEG layer may be no further than 250 nanometers from the substrate, no further than 500 nanometers from the substrate, no further than 750 nanometers from the substrate, no further than 1 micron from the substrate, or no further than 100 microns from the substrate.

In some examples, the buffer layer may comprise a group III-V semiconductor. In some examples, the barrier layer may comprise a group semiconductor. In some examples, the buffer layer comprises GaN and the barrier layer comprises AlGaN. In some examples, the buffer layer comprises GaAs and the barrier layer comprises AlGaAs. In some examples, the buffer layer comprises GaN and the barrier layer comprises InGaN. In some examples, the buffer layer comprises GaAs and the barrier layer comprises InGaAs. In some examples, the buffer layer comprises a group III-V semiconductor of a first dopant level, and the barrier layer comprises a group III-V semiconductor of a second dopant level. In some examples, the buffer layer comprises a group III-III'-V semiconductor of a first dopant level, and the barrier layer comprises a group III-III'-V semiconductor of a second dopant level.

In some examples, a chip (e.g., chip 100B) may comprise an active device, comprising GaN (e.g., GaN and AlGaN), disposed on a synthetic diamond substrate (e.g., substrate 104). In some examples, the chip may comprise a substrate comprising synthetic diamond (e.g., substrate 104). In some examples, the chip may be a GaN-based HEMT integrated on a synthetic diamond substrate (e.g., substrate 104). The chip may be a MIMIC, comprising one or more GaN-based HEMTs, integrated on a synthetic diamond substrate (e.g., substrate 104). The substrate may comprise a thickness of at least 1 micron of diamond. The substrate may comprise a thickness of diamond of at least about 1 micron, at least about 10 microns, at least about 100 microns, at least about 1 millimeter or more. The substrate may comprise a thickness of at least 1 millimeter of diamond. The substrate may comprise a thickness of diamond within a range from 1 micron to 1 millimeter, within a range from 10 microns to 1 millimeter, or within a range from 100 microns to 500 microns. In some examples, the substrate may comprise a thickness of diamond from about 20 nanometers (nm) to about 2,000 nm.

Diamond can provide high thermal conductance. A substrate comprising diamond may have a higher thermal conductance compared to substrates not comprising diamond. Depending on the manufacturing conditions, in some examples, the thermal conductivity of synthetic diamond may range from about 800 to 2200 W/mK. In some examples, the thermal conductivity of synthetic diamond may range from about 50 W/mK to about 500 W/mK. In some examples, a diamond substrate may comprise a thermal conductivity of at least about 1000 W/mK. In other examples, the thermal conductivity of a diamond substrate may be greater than at least about 500 W/mK, 1000 W/mK, 2000 W/mK, 3000 W/mK, or more. The thermal conductivity of a diamond substrate may be within a range from about 500 W/mK to about 2000 W/mK. The thermal conductivity of a diamond substrate may be within a range from about 500 W/mK to about 3000 W/mK.

In some aspects, chip 100B may comprise an intermediate layer (not shown in FIG. 1B), such as a nucleating layer, between the one or more layers 105 and the substrate 104. In some aspects, a nucleation layer may not be a separate layer (e.g., may not be disposed on the layered structure as a separate layer), for example, the layered structure can include nucleation material that may be grown within the layered structure itself. In some aspects, the nucleation layer may be used for nucleating growth of diamond on the one or more layers 105, for example, in aspects where the substrate 104 is diamond. Synthetic diamond may be nucleated and grown on a surface of a nucleating layer or on a surface of a nucleating material included in the one or more layers 105. The thickness of the nucleating layer that is sufficient for diamond nucleation can depend on the material used for nucleation. In some aspects, the nucleating layer may be formed on a surface of the one or more layers by deposition of amorphous SiN, SiC or AlN. The nucleating layer may also be formed, e.g., as a final step, in the formation of the one or more layers 105. In such cases, instead of depositing a separate nucleating layer on a surface of the one or more layers 105, the growth process of the one or more layers 105 may be finalized by the addition of a nucleating material (e.g., SiN, SiC or AlN) to the existing material of the layered structure (e.g., addition of a nucleating material to existing GaN or to a combination of GaN and AlN).

In some aspects of chip 100B, diamond (e.g., substrate 104) may be disposed or grown over or on the one or more layers 105, wherein the diamond and at least one layer of the one or more layers 105 form an interface. For example, at least one layer of diamond may be deposited over at least a portion of a layer or surface of the one or more layers 105 at an interface (e.g., at a single interface). In some aspects, the interface can be a single interface between the diamond (e.g., of the substrate 104) and the one or more layers 105 that includes at least a portion of the diamond in contact (e.g., direct contact) with at least a portion of the one or more layers 105. A single interface between the diamond and the one or more layers 105 can be a surface that forms a boundary between the diamond and the one or more layers. Direct contact between the diamond (e.g., of the substrate 104) and the one or more layers 105 at a single interface can include atoms of at least one layer of the one or more layers 105 combining with atoms of the diamond.

In some aspects, the diamond substrate (e.g., 104) and the semiconductor substrate (e.g., 105) may be lattice-matched. In some aspects, the semiconductor substrate (e.g., 105) may be lattice-matched to the diamond substrate (e.g., 104). In some aspects, the diamond substrate (e.g., 104) may be lattice-matched to the semiconductor substrate (e.g., 105).

In some aspects the diamond substrate (e.g., 104) and the semiconductor substrate (e.g., 105) may be lattice-matched with an interface region between the diamond substrate and the semiconductor substrate. In some aspects, the diamond substrate may be lattice-matched to the semiconductor substrate (or the semiconductor substrate may be lattice-matched to the diamond substrate) via the interface region.

In some aspects, the interface (e.g., interface region) between the diamond substrate (e.g., 104) and the semiconductor substrate (e.g., 105) may comprise at least part of the diamond substrate. In some aspects, the interface region may comprise at least part of the semiconductor substrate.

In some examples, an interface (e.g., interface region) between a substrate comprising diamond (e.g., substrate 104) and a substrate comprising semiconductor (e.g., the one or more layers 105) may be measured, for example, by Raman spectroscopy or another method. In some aspects, such interface may exhibit an sp3 carbon peak at about 1332 $cm^{-1}$ having a full width half maximum of no more than 5.0 $cm^{-1}$. An RF chip comprising such aspects of the diamond substrate and the semiconductor substrate (e.g., 104 and 105, chip 100B) may be configured for transmitting or receiving data at a transfer rate of at least 500 megabits per second and a frequency of at least 8 GHz.

In some aspects, the diamond substrate (e.g., 104) and the semiconductor substrate (e.g., 105) may be lattice-matched such that an RF chip comprising such aspects of the diamond substrate and the semiconductor substrate (e.g., 104 and 105, chip 100B) may be configured for (i) outputting an effective radiated power within a range from 5 W to 42 W, within an antenna gain less than 30 dBi, for an input power less than or equal to 2 W in a linear regime, and (ii) transmitting or receiving data at a transfer rate of at least 500 megabits per second.

In some aspects, the diamond substrate (e.g., 104) and the semiconductor substrate (e.g., 105) may be lattice-matched such that a thermal conductivity across the diamond substrate and the semiconductor substrate is greater than or equal to 1000 W/mK, and such that an RF chip comprising such aspects of the diamond substrate and the semiconductor substrate may be configured for transmitting or receiving data at a transfer rate of at least 500 megabits per second and a frequency of at least 8 GHz.

In some aspects, the diamond substrate (e.g., 104) and the semiconductor substrate (e.g., 105) may be lattice-matched such that an RF chip comprising such aspects of the diamond substrate and the semiconductor substrate (e.g., 104 and 105, chip 100B) may be configured for (i) outputting an effective radiated power within a range from 5 W to 42 W with a carrier to noise ratio of greater than 25 dB, and (ii) transmitting or receiving data at a transfer rate of at least 500 megabits per second and with a bandwidth within a range of at least 50 MHz.

In some aspects, the diamond substrate (e.g., 104) and the semiconductor substrate (e.g., 105) may be lattice-matched such that an RF chip comprising such aspects of the diamond substrate and the semiconductor substrate (e.g., 104 and 105, chip 100B) may be configured for (i) outputting an effective radiated power within a range from 5 W to 42 W with a noise power ratio (NPR) of less than 20 dB and (ii) transmitting or receiving data at a transfer rate of at least 500 megabits per second and a frequency of at least 8 GHz.

The package base 106 shown in FIG. 1B, in some aspects, may be part of another component or may be disposed onto another component. The package base 106 may be configured to conduct heat from the chip 100B. The package base 106 may be configured to conduct heat from the chip 100B to a heat transfer element. A heat transfer element may be attached to the package base 106 at surface 113. In some aspects, the surface 113 may be referred to as a baseplate. The chip 100B or a package comprising the chip 100B may include other components and electrical connections not shown in the illustrated figure, such as a solar photovoltaic arrays, batteries, antennae (e.g., antenna array), gyroscopic pointing controllers, etc. In some aspects, a package comprising the chip 100B may be a satellite. In some aspects, a package comprising the chip 100B may be a cubesat or a microsat.

In some examples, heat dissipation from a satellite may occur through radiation of electromagnetic waves into space (e.g., black-body radiation). In some cases, thermal management of a chip (e.g., chip 100B) or a package comprising the chip 100B, such as a satellite, may include radiative cooling. In some examples, cooling (e.g., device cooling) at a location on (or proximal to) the surface of the Earth may include dissipation of heat into a surrounding environment at least in part by air or liquid convection. Without being limited by theory, heat dissipation from a black-body into space may depend on the temperature of the radiating surface according to Stefan-Boltzmann law: $P=\sigma T^4$, where $$P\left[\frac{W}{m^2}\right]$$

is the power density emitted by a surface, $\sigma=56.7$ nW/m²/K⁴, Stefan-Boltzmann constant, and T [K] is absolute temperature.

In some examples, a device (e.g., package) comprising the chip 100B may comprise a radiant element (e.g., radiant cooling element). In some examples, a radiant cooling element may comprise a surface. Radiant cooling elements may comprise a surface of the device (e.g., a surface of the device that is exposed to space) and may be configured to emit electromagnetic radiation. The radiant cooling element may emit electromagnetic radiation such as radiating heat into space. In some examples, a radiant cooling element may not comprise fins, such as fins used as heat sinks for electronics. Radiant cooling elements may utilize a surface pointing away from the device to emit electromagnetic radiation (e.g., into space). In some cases, a radiant cooling element may comprise one or more louvers to alter the emissivity of the surfaces.

In some aspects, the package may comprise a heat pipe cooling system. A heat pipe cooling system may comprise a recirculating closed fluid system in which a cooling liquid is brought to the location where heat is generated (e.g. location of an RF power amplifier), and the liquid may be evaporated by latent heat consumption. The gas phase may be guided through pipes to a radiant cooling element where the gas may be condensed to the liquid phase thereby releasing the heat. In some examples, a heat pipe cooling system and a heat conducting structure may comprise a part of a package base. The package base may be configured for heat dissipation from a heat source, such as an RF power amplifier to another location where the heat may be dissipated, such as a radiant cooling element.

In some cases, only a small fraction of electrical power for use in operating a chip (e.g., chip 100B) may be converted to electromagnetic signals for transmission (e.g., from a satellite to Earth). In some cases, a significant fraction of such power may be converted to heat by electronics in a package, for example, heat generated by such electronics. The electronics may comprise one or more components, for example, a control unit, a receiver, a transmitter, and a payload. Such generated heat may be dissipated (e.g., into space) via cooling radiators. An amount of power converted to electrical signals relative to that which is converted to heat may depend on the amplifier efficiency. In some examples, such as satellite-based communication, the thermal inefficiency of a power amplifier may be a dominant source of dissipated heat during a communication cycle.

In some aspects, a maximum temperature ($T_{DEV}$) of the active region 109 of chip 100B may be controlled. A manufacturer's specification for the maximum allowed temperature may be defined as $T_{DEV}$(max). The performance of the device and expected lifetime may be qualified for temperatures not exceeding the maximum temperature $T_{DEV}$(max). In some cases, the value of $T_{DEV}$(max) may range from 150° C. to 225° C. $T_{DEV}$(max) may depend on the manufacturer and type of material. In some cases, the systems and methods described herein may reduce resistance to heat flow from a heat source (e.g., 109) below the transistor contacts though the package base 106 and the surface 113 (e.g., and further to a radiant cooling element), as illustrated with heat-flow lines 107. The heat may later be dissipated away from a device that comprises chip 100B, for example, into space. Accordingly, the systems and methods described herein may improve thermal efficiency and performance of devices that include microwave power amplifiers.

The disclosed systems and methods may also improve linearity of microwave power amplifiers. In some aspects, for a given output power and linearity specification, as compared to a conventional amplifier of a similar or same size, a power amplifier (e.g., comprising chip 100B) generated according to the methods described herein may exhibit a higher maximum output power and higher PAE. The higher maximum output power may result in a higher power output saturation (e.g., P3 dB) level. A power amplifier with a higher P3 dB level may use a larger input power back-off while maintaining a maximum power flux-density (PFD) value that is compliant with a specified PFD limit, and this may not be possible for a conventional power amplifier. Aspects of power amplifiers disclosed herein can provide large input power back-off values without leading to substantial reductions in efficiency. Aspects described herein can provide improved power amplifier linearity by reducing the distortion effects of higher order intermodulation products (e.g., third order or fifth order intermodulation products) on a modulated carrier signal.

The rate of information transfer from a transmitter (e.g., satellite) to a receiver (e.g., an Earth station) may depend on a number of factors. A link budget may comprise an estimate of an information transfer rate. In some cases, a link budget may estimate a bit-error ratio achievable when detecting a satellite signal at the Earth station. The bit-error ratio in turn may depend on the ratio of the intensity of the modulated signal received at Earth relative to the noise captured and the noise contributed by an Earth station receiver. Both the noise level and the number of bits of information that can be transmitted per second may increase with the instantaneous (e.g., analog) bandwidth B[Hz] of the modulated signal for which the receiver is designed. Without being limited by theory, the maximum information transfer rate or a channel capacity C [bits/s] may be given by the Shannon-Hartley theorem:

$$C = B\log_2\left(1 + \frac{S}{N}\right),$$

where B [Hz] is the analog modulation bandwidth, and $$\frac{S}{N}$$

is the signal to noise ratio.

This limit may be an upper bound for error-free or low-error information transfer in the presence of noise, as defined by the $$\frac{S}{N}$$

ratio. In some cases, one may come arbitrarily close to this limit by encoding the information with a suitable coding scheme. In some cases, the coding scheme may include forward-error correction and a type of modulation protocol. A modulation protocol may define a bandwidth B. In narrowband communications, the modulated carrier may be the signal, hence the carrier-to-noise ratio at the receiver may be given by:

$$CNR = \frac{P_{RX}}{N},$$

where $P_{RX}$[W] is a (e.g., received) carrier signal power and N[W] is a noise power level (e.g., as seen at a decision circuit in a receiver). In some examples, amplifier (e.g., wall-plug) efficiency may be defined as $$\eta = \frac{P_{TX}}{P_{DC}}$$

where $P_{TX}$[W] is an output or transmitted power (e.g., from the amplifier) in a modulated signal around a carrier signal(s) and $P_{DC}$[W] is the DC power delivered to the amplifier. In some examples, $P_{DC}$ may be defined as power delivered to (e.g., an analog portion of) an amplifier chip, which comprises at least one driver stage and one output stage, and does not include modulators, local oscillator, or digital-to-analog (D/A) converters. In other words, the DC power may be the power delivered to the amplifier chip, or the power delivered to the portion of the amplifier chip that contains the driver stage and the output stage. The amplifier chip may be a (e.g., wide-bandgap) semiconductor chip. The output power $P_{TX}$ and $P_{DC}$ can vary with the input RF signal power $P_{IN}$, and the efficiency $\eta$ can vary with the $P_{IN}$. PAE may be defined as $$PAE = \frac{(P_{TX} - P_{IN})}{P_{DC}}$$

where $P_{TX}$ and $P_{DC}$ are as described above, while $P_{IN}$ is the power delivered to the input terminal of the amplifier chip.

In some cases, a wireless communication system link budget (e.g., a downstream satellite link budget) may comprise at least three parts: (1) power emitted from a satellite transmitter in the direction of an Earth receiver station, referred to as the Effective Isotropic Radiative Power (EIRP) [W] given as the EIRP=$P_{TX}G_{TX}$, where $G_{TX}$ is transmitter antenna gain; (2) link losses such as path loss, which may include free-space propagation loss, atmospheric and rain absorption and beam depolarization collectively denoted by L, and may depend on a type of orbit, altitude, and carrier frequency of the system; and (3) received power $P_{RX}$ [W] at a station (e.g., ground station). The above parts may depend indirectly on a carrier frequency ($f_o$) and an instantaneous bandwidth of modulation (B). The expression for received carrier-to-noise ratio (CNR) may be written as:

$$CNR = \frac{1}{k} \cdot \frac{EIRP}{B} \cdot \frac{1}{L} \cdot \frac{G_{RX}}{T_{SYS}}, \text{ or}$$

$$CNR[\text{dB}] = -228.6\left[\frac{\text{dBW}}{k \cdot \text{Hz}}\right] + \left(\frac{EIRP}{B}\right)\left[\frac{\text{dB}}{\text{Hz}}\right] - L[\text{dB}] + \left(\frac{G_{RX}}{T_{SYS}}\right)\left[\frac{\text{dB}}{K}\right]$$

if quantities are expressed in dB.

In the example above, $G_{RX}$ is receiving antenna gain, $T_{SYS}$ [K] is system noise temperature, and k is Boltzmann constant. The term $$\frac{G_{RX}}{T_{SYS}}$$

may apply for quantity) an entire receiver system and account for antenna noise and noise added by the electronics of the receiver system, e.g., at system temperature $T_{SYS}$. Link losses (L) may depend, at least in part, on a selection of orbit and frequency. In some examples, transmitter power spectral density (e.g., in a direction of a receiving station) may be defined, at least in part, by transmitter output power $P_{TX}$, transmitter antenna gain $G_{TX}$, and the bandwidth B of the modulation. In some examples, a specified bit-to-error ratio may be achieved, at least in part, by selecting a particular type of modulation for transmitting information (e.g., on a carrier signal) and the type of modulation may be expressed in a specified carrier-to-noise CNR ratio (e.g., at a receiver).

In some examples, a satellite link budget may comprise a power flux density (PFD) value (e.g., maximum PFD) of a satellite signal reaching the surface of the Earth from a satellite(s). The International Telecommunication Union (ITU) has established maximum permissible values of power flux densities of satellite signals, for example, in Article 21.16 of the ITU Radio Regulation PFD limits. A limitation of maximum permissible PFD may be computed in the following manner: for satellite emission spectrum around a carrier $f_0$, the maximum flux-density $$P_{FD}\left[\frac{W}{m2}\right]$$

arriving from the satellite at any elevation θ and measured at the surface of the Earth, integrated over an incremental bandwidth $B_{FD}$ (specified by the regulation) may not exceed the PFD limitations specified by Article 21.16. With frequency $f_0$, altitude $r(\theta)$ (e.g., from the orbit choice) and instantaneous emission bandwidth B, one can determine the maximum EIRP [W], for example, according to $$\frac{P_{FD}^{MAX}}{B_{FD}} \geq \frac{1}{4\pi r^2(\theta)} \cdot \frac{EIRP}{B}\left[\frac{W}{m^2 Hz}\right].$$

Maximum transmitter output power $P_{TX}$=[W] may be obtained from antenna gain $G_{TX}$ as $$P_{TX} = \frac{EIRP}{G_{TX}}.$$

Such maximum transmitter output power may define the limit of legal operation of the satellite downstream transmitter system and may be a design consideration of satellite transmitters. With an orbit and transmitter antenna gain, the PFD limit may define a maximum legal output power of a satellite transmitter.

In some examples, a link budget may be a product (or, alternatively a sum if quantities are expressed in dB) of signal power terms. The signal power terms may start with the transmitter output power, and may be successively increased by gains (e.g., antenna gains) and reduced by losses (e.g., free-space loss and absorption). The result may be divided by the noise power and the carrier-to-noise ratio used by the specified modulation algorithm to achieve a certain bit error rate upon detection. If this product equals unity (e.g., equal to one), the link may be at a threshold of specified operation. If the product is greater than unity, the margin may be said to be positive, and the link may be operating with a better bit-error ratio than it does at the threshold. Conversely, if the product is less than unity, the link margin may be negative, and the link may be operating at a lower bit-error ratio than it does at the threshold. In some examples, the link budget may be designed for a certain level of availability expressed as an availability percentage (e.g., 99.99% availability). Because of fluctuating atmospheric conditions, satellite link budgets may be computed assuming a certain probability of availability.

In some cases, given a maximum transmit power (e.g., under the ITU Radio Regulation PFD limits), a design consideration for a transmitter may include transmitting a maximum power while meeting a certain satellite energy budget (e.g., link budget) and maintaining amplifier linearity for all powers up to the maximum transmit power. One parameter of the energy budget may be the transmitter output power ($P_{TX}$), and the transmitter power added efficiency (PAE) may be defined as $$PAE = \frac{(P_{TX} - P_{IN})}{P_{DC}},$$

where $P_{IN}$ is the power delivered to the input of the transmitter amplifier, and $P_{DC}$ is the DC power (e.g., energy per unit time) delivered to the transmitter to achieve $P_{TX}$ RF power emitted from the transmitter.

In some examples, a linearity constraint may be used to maintain the fidelity of the signal shape under modulation when received by the receiver. A degree of amplifier nonlinearity may depend on a signal amplitude of a signal being amplified. In some examples of an RF amplifier, the output transistor may operate as a controlled current source, for example, in a linear region of a transistor output characteristic. Such amplifiers may be referred to as "linear" amplifiers. In some examples, circuit configurations for amplifiers may comprise class A, AB, and B microwave amplifiers. An amplifier's linearity or nonlinearity may be defined in part by one or more intermodulation products (e.g., signal distortions). In some examples, amplifier nonlinearity may be quantified by evaluating intermodulation product(s) present in a signal, and such intermodulation products can result from a sinusoidal signal passing through a nonlinear element (e.g., power amplifier). Distortion of a modulated sinusoidal signal (e.g., reaching a receiver) may include distortions caused by intermodulation products (e.g., between odd harmonics of the signal and the fundamental signal or carrier signal). Such intermodulation products can include, for example, a third-order intermodulation product (e.g., IMP3) and a fifth-order intermodulation product (e.g., IMP5). These intermodulation products may appear within an instantaneous bandwidth of the intended modulation. Signal distortion may corrupt an amplitude and phase of a modulated signal such that a receiver may not be able to detect and reconstruct information from the signal.

In some examples, as an input signal (e.g., to a power amplifier) approaches $$\frac{P_{SAT}}{G[W]},$$

the output signal from the amplifier becomes distorted. If the input signal has an amplitude that is much smaller than the saturation output power $P_{SAT}$ [W], the amplifier may be operating close to linear and a power gain $$G = \frac{P_1}{P_{IN}}$$

of the amplifier may be constant (e.g., $P_1$ may be the useful signal output power from the transmitter). A figure of merit for a modulation scheme may be the ratio of the information transfer expressed in bits/s to the instantaneous (e.g., analog) bandwidth expressed in Hertz and is referred to as the spectral efficiency. For example, 16QAM modulation exhibits 4 bits/s/Hz, while digital TV standard DVB-T2 has spectral efficiency greater than 5 bits/s/Hz. Many modulation schemes with large spectral efficiencies employ both amplitude and phase modulation and, therefore, may depend on the amplifier linearity to place the symbols accurately in a constellation diagram. In some examples, qualifying a transmitter for a specific use may include satisfying one or more standards that regulate the amounts of permissible intermodulation products of an amplifier (e.g., within such transmitters). Amplifiers driven close to or into saturation (e.g., emitting power close to $P_{SAT}$) may have unacceptable levels of signal distortion, and hence too much power emitted in the intermodulation products. In some cases, bringing an amplifier into linearity compliance, in accordance with the aforementioned standards, may include employing a combination of input power back-off and digital pre-distortion (DPD) algorithms to reach sufficient amplifier linearity. A back-off procedure may comprise reducing an amplifier input power $P_{IN}$ from $$\frac{P_{SAT}}{G}$$

to a point where any intermodulation products are reduced to an acceptable level (e.g., or a bit error rate is brought down to a selected level). An amount of input power reduction may be referred to as back-off (BO) and is most often expressed in dB. In some examples, BO values may range from 3 to 10 dB, depending on amplifier linearity and quality.

Linear amplifiers may exhibit some small level of non-linearity in an entire dynamic range (e.g., dynamic range of operation), however, a residual nonlinearity may generally be lower than that for acceptable operation and may be manageable using DPD. In some examples, a modulation scheme may be characterized by at least four parameters, including symbol rate, bits/symbol efficiency, instantaneous bandwidth, and peak-to-average-power ratio (PAPR). A type of modulation used may directly determine the bits/symbol efficiency and the PAPR. In some examples, amplitude modulation schemes which use several bits/symbol may have PAPR reaching 10 dB. In such schemes, the average power in the modulated carrier may be ten times lower than the power in the unmodulated carrier. Amplitude modulation may result in significant reduction in average output power relative to the continuous-wave (CW) signal. In some examples, the amplitude modulation scheme may result in instances during which the output power may be much smaller than the peak output power (e.g., the average may be smaller than the peak $P_{TX}$ value). Peak to average power ratio greater than unity may further reduce the amplifier efficiency.

Figure 2:
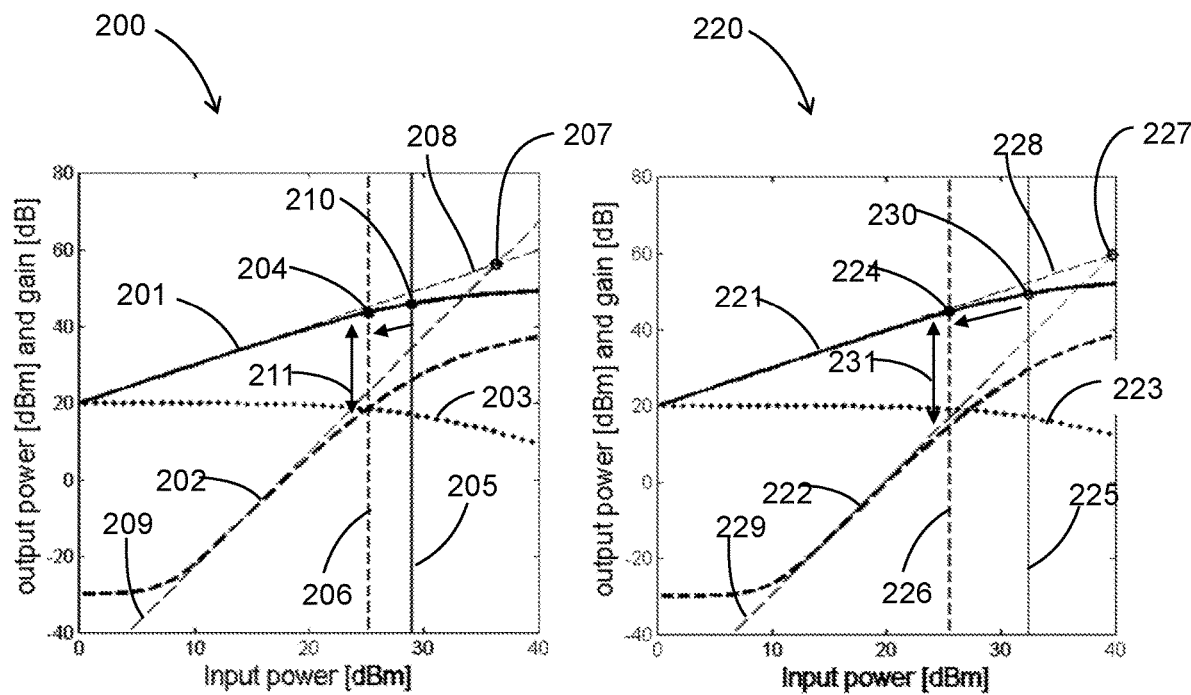
FIG. 2 illustrates example amplifier linearity characteristics, in accordance with some aspects.

FIG. 2 illustrates example amplifier linearity characteristics, in accordance with some aspects. In some aspects, FIG. 2 illustrates differences in amplifier linearity of a conventional amplifier compared to an amplifier having improved thermal efficiency. In some aspects, an amplifier having improved thermal efficiency comprises GaN-on-diamond (GaND), in accordance with the aspects disclosed herein. For example, an amplifier having improved thermal efficiency may comprise a GaND chip. In some aspects, a GaN chip may comprise aspects similar to chip 100B of FIG. 1B. In some aspects, a GaN chip may comprise a MIMIC.

The plots 200 and 220 of FIG. 2 qualitatively illustrate various components of the output RF power on the vertical axis as a function of the input RF power $P_{IN}$ [W] on the horizontal axis. Plot 200 of FIG. 2 illustrates the output power in the fundamental harmonic, the third-order intermodulation, and the gain of a conventional amplifier, for example, a GaN-on-SiC amplifier. Plot 200 illustrates output power 201 in the fundamental harmonic $P_1$[W] as a function of input power $P_{IN}$. In some cases, $P_1$ may be the power within a modulation bandwidth around a carrier frequency $f_0$ of a signal. Plot 200 illustrates the power resulting from third-order intermodulation IMP3 [W] 202 as a function of the input power $P_{IN}$ (e.g., the comparison being qualitative or relative). Plot 200 illustrates the gain $$G = \frac{P_1}{P_{IN}} 203$$

experienced by a signal to be amplified. The third-order intermodulation 202 is a disturbance within the signal 201, and constitutes signal distortion to be reduced, in order to allow improved detection of the information carried by the modulated signal $P_{IN}$. The flattening in the IMP3 curve 202 in the low $P_{IN}$ regime may qualitatively represent the residual distortion in the amplifier. The intersection 207 between the linear extrapolation of P1, shown by the dashed line 208, and the linear extrapolation of IMP3, shown by the dashed line 209, is referred to as the third-order intercept (TOI) [W] and may be a figure-of-merit for characterizing nonlinearity of an amplifier.

Referring to plot 200, for low input power, the output power curve 201 may be close to linear, and hence the gain G shown with curve 203 is relatively constant in a linear regime. In some cases, the gain may tend to fall off with input power $P_{IN}$ slower than it is implied by curve 203, and the gain fall off may depend on the amplifier material and design. As the input power $P_{IN}$ is increased, a point may be reached where the amplifier starts saturating and the gain drops, for example, as shown in the flattening of the output power curve 201 and reduction in the gain curve 203. The output power at which the gain curve has reduced by 3 dB relative to its value at low power is referred to as the P3 dB output level 210. The input power $P_{IN}$ for which the output power $P_1$ equals P3 dB is referred to as the input power for P3 dB and shown by vertical line 205.

In some cases, a P×dB power definition may be used for referring to an output power at which amplifier gain reduces by x dB. As noted above, if the amplifier were used in saturation (e.g., with the input signal reaching input power for $P_1$ dB), the corresponding output signal emitted by the amplifier (P1+1MP3+ . . . ) would be distorted. This distortion may be quantified with the ratio $P_1$/IMP3, expressed in dBc, where $P_1$ is the power in the carrier signal 201, and IMP3 is the power in the third order intermodulation signal 202. As shown in the plot 200, this ratio (e.g, vertical separation between curves 201 and 202 at any $P_{IN}$) can be rather low. Operation at $P_1$ dB may be insufficient for reliable communication, and amplifier linearization with that level of distortion may not be practical. The $P_1$/IMP3 ratio decreases with increased input power $P_{IN}$, because $P_1$ increases approximately linearly with $P_{IN}$ (e.g., large part of curve 201 may have a first slope as illustrated by the line 208 in plot 200), while IMP3 increases with the third power of $P_{IN}$ (e.g., large part of curve 202 may have a second slope as illustrated by the line 209 in plot 200).

In some examples, adequate linearity may be achieved at less than or equal to the level of input power $P_{IN}$ at which the ratio $P_1$/IMP3 reaches a target value for a specific modulation. The target ratio may vary depending on the end application. For example, for many wireless standards, a target ratio may be greater than 50 dB. For purposes of illustration, in FIG. 2, the target $P_1$/IMP3 ratio may be 25 dBc. The reduction of $P_{IN}$ from P×dB to the linearity condition may be referred to as back-off, and the maximum output power for which the linearity condition is satisfied may be referred to as $P_1^{LIN}$. The plot 200 illustrates this qualitatively with input power $P_{IN}$ reduced by approximately 4 dB from the P3 dB point 210 (e.g., input power level shown with vertical line 205) to a lower level shown with the dashed vertical line 206 and the output power $P_1^{LIN}$ denoted at point 204. The output power $P_1^{LIN}$ may be less than or equal to the $P_{FD}$ limit. The target linearity (e.g., $P_1$/IMP3=25 dB) and efficiency (e.g., PAE≈18%) of the conventional amplifier shown by the left plot in FIG. 2 may be achieved with a 4-dB back-off (e.g., horizontal separation between lines 205 and 206 as measured in dB).

Plot 220 of FIG. 2 qualitatively illustrates the output power in the fundamental harmonic, the third-order intermodulation, and the gain of an amplifier of the present disclosure. The amplifier may be a GaN amplifier comprising a high thermal conductivity substrate (e.g., may comprise chip 100B). For example, the amplifier may comprise a GaND substrate. Shown in plot 220 is the output power 221 in the fundamental harmonic $P_1$[W] as a function of input power $P_{IN}$. In some cases, $P_1$ may be the power within the modulation bandwidth around the carrier frequency $f_0$. Plot 220 illustrates the power resulting from third-order intermodulation IMP3 [W] 222 as a function of the input power $P_{IN}$ (e.g., the comparison being qualitative or relative). Plot 220 illustrates the gain $G=P_1/P_{IN}$ 223 experienced by the signal to be amplified. The third-order intermodulation 222 is a disturbance within the signal 221, and may indicate an amount of signal distortion to be reduced, for example, to allow improved detection of the information carried by the modulated signal $P_1$.

The flattening of the IMP3 curve 222 in the low $P_{IN}$ regime may qualitatively represent the residual distortion in the amplifier. The intersection 227 between the linear extrapolation of $P_1$, shown by the dashed line 228, and the linear extrapolation of IMP3, shown by the dashed line 229, is referred to as the third-order intercept (TOI) [W] and may be a figure-of-merit for characterizing nonlinearity of an amplifier. Referring to plot 220, for low input power, the output power curve 221 may be close to linear, and hence the gain G shown by curve 223 may be relatively constant in that linear regime. In some cases, the gain may tend to fall off with input power $P_{IN}$ slower than it is implied by curve 223, and the gain fall off may depend on the amplifier material and design. As the input power $P_{IN}$ is increased, a point may be reached where the amplifier starts saturating and the gain drops, as shown by the flattening of the curve 221 and reduction in the gain curve 223. The output power at which the gain curve has reduced by 3 dB relative to its value at low power is referred to as the P3 dB output level 230. The input power $P_{IN}$ for which the output power $P_1$ equals P3 dB is referred to as the input power for P3 dB and shown by vertical line 225.

In some aspects, an amplifier chip may have operational characteristics as shown in plot 220, and may be built having the same size as a conventional amplifier chip having the operational characteristics as shown in plot 200. In comparison to the characteristics shown in plot 200, the amplifier of plot 220 may provide more output power (e.g., as indicated by the P3 dB point 230), which is approximately 3 dB larger than the P3 dB value shown at 210 on plot 200. The example amplifier may have a higher power output compared to a conventional amplifier of the same (or similar) size. In some aspects, to reduce the output power $P_1$ to meet a value set by a PFD specification, the input power $P_{IN}$ may be backed-off until output power $P_1$ equals the $P_1^{LIN}$ output power fixed by the $P_{FD}$ limit (e.g., of the PFD specification), for example, as shown by point 224 in plot 220, which may be analogous to point 204 in plot 200. In some aspects, the example amplifier of plot 220 may have a P3 dB larger than the P3 dB shown in plot 200 while also having a larger BO to reach $P_1^{LIN}$. Accordingly, in some aspects, the ratio $P_1$/IMP3 (e.g., 231) for the example amplifier of plot 220 may be larger than such ratio for the conventional amplifier (e.g., 211) of plot 200. The back-off amount may be shown by the separation between vertical lines 225 and 226 in plot 220. In some aspects, the $P_1$/IMP3 ratio for the example amplifier of plot 220 may be 30 dB, larger than the $P_1$/IMP3 value obtained with the conventional amplifier of plot 200. A higher $P_1$/IMP3 ratio (e.g., for the example amplifier of plot 220) may indicate that the example amplifier has a higher linearity compared to the conventional amplifier.

In conventional amplifiers, backing off the input power may have at least two deficiencies: (i) a larger amplifier may be needed for achieving a particular transmit power, such as an amplifier having a saturation level equal to at least $P_{TX}$·BO and (ii) the power added efficiency (PAE) of linear amplifier may reduce with increased back-off (e.g., increasing BO reduces PAE). Aspects of the present disclosure can mitigate at least the above deficiencies. First, aspects of the disclosed amplifier (e.g., comprising chip 100B) may provide larger output power compared to conventional amplifiers of the same (or similar) size. As such, aspects of the disclosed amplifier may provide a desired transmit power $P_{TX}$ without necessarily requiring an increase in amplifier size. In contrast, conventional amplifiers may typically be increased in size to meet the same (or a similar) desired transmit power $P_{TX}$. Some aspects of the present disclosure may allow for a smaller amplifier to be used in order to meet the desired $P_{TX}$. In some aspects, the disclosed amplifier may have a larger input power back-off, compared to a conventional amplifier, without experiencing a substantial reduction in PAE allowing for greater efficiency and improved linearity.

Figure 3:
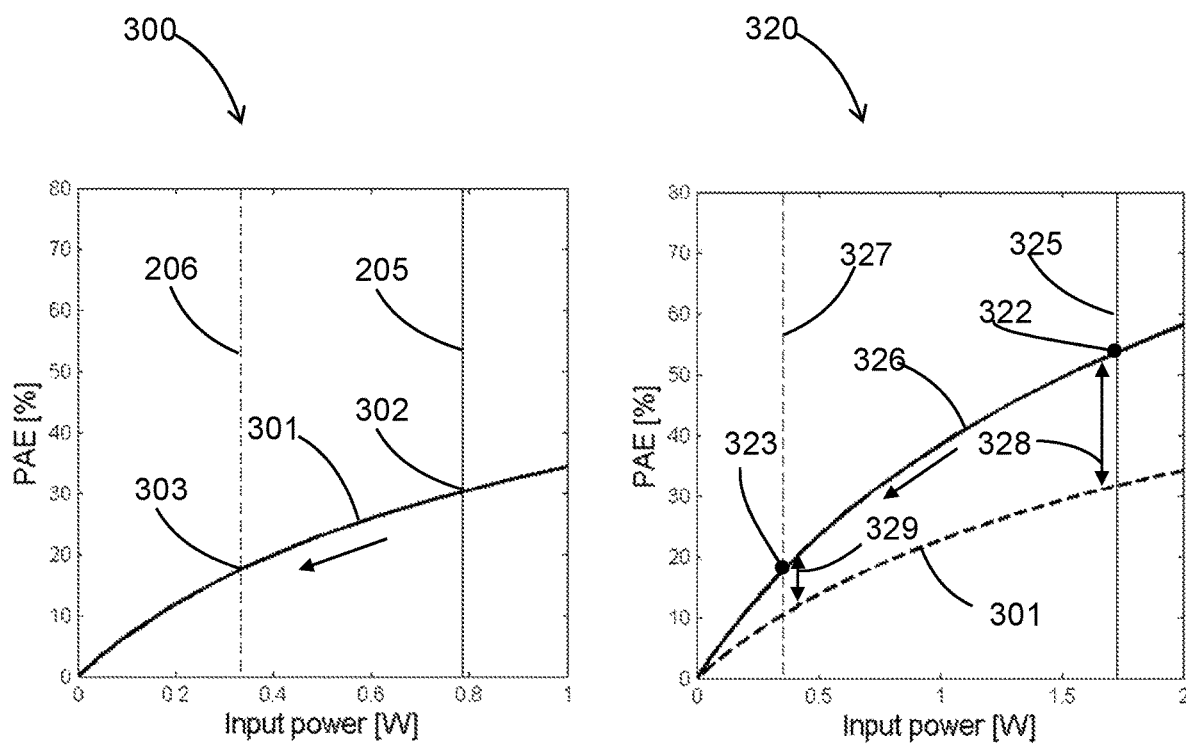
FIG. 3 illustrates power added efficiency (PAE) characteristics of an example amplifier, in accordance with some aspects.

FIG. 3 illustrates power added efficiency (PAE) characteristics of an example amplifier, in accordance with some aspects. In some aspects, FIG. 3 illustrates differences in PAE of a conventional amplifier compared to an amplifier having improved thermal efficiency. Some aspects of an amplifier having improved thermal efficiency include an amplifier comprising a chip, such as a MMIC, comprising a wide-bandgap semiconductor material (e.g., GaND chip). In some aspects, such a chip may be similar to (or the same as) chip 100B of FIG. 1B.

Plot 300 and plot 320 of FIG. 3 qualitatively illustrate the PAE[%] on the vertical axis as a function of the input RF power [W] on the horizontal axis. In some aspects, plot 300 corresponds to the efficiency of a conventional amplifier, for example, an amplifier comprising GaN on SiC substrate(s). In some aspects, plot 320 corresponds to the efficiency of the disclosed example amplifier (e.g., comprising chip 100B), having improved thermal management. As shown in plot 300 of FIG. 3, an amplifier that exhibits high PAE at peak power (e.g., approximately P3 dB) may under back-off operate at a lower average power $P_1^{LIN}$ and exhibit PAE that can be significantly lower than it would be at peak power (e.g., P3 dB). Such a phenomenon, for example, may be qualitatively illustrated in plot 300 which illustrates PAE 301 as a function of the input power $P_{IN}$. The efficiency 302 at P3 dB (e.g., intersection of line 205 and the efficiency curve 301) is approximately 30%, but when the amplifier is backed off by 4 dB, the efficiency drops to approximately 18% (e.g., intersection of the line 206 and the efficiency curve 301), denoted by point 303.

Plot 320 qualitatively illustrates the effect on PAE versus input power of an amplifier having improved thermal efficiency. In some aspects, such an amplifier may comprise a chip (e.g., chip 100B), such as a MMIC chip, comprising a high thermal conductivity substrate (e.g., diamond) and the chip may have a lower thermal resistance than an equally sized chip comprising a lower thermal conductivity substrate (e.g. SiC). In accordance with plot 320 of FIG. 3, an amplifier of the present disclosure chip may have improved output power levels (e.g., 3 dB or higher improvement in P3 dB) and improved PAE values (e.g., 20% to 30% improvement in PAE) relative to conventional technology for a same size chip.

Aspects of the disclosed amplifier provide for operating such an amplifier using lower operating back-off values. Referring to line 301 in plot 320, a conventional (e.g., enlarged) amplifier operates at a reduced efficiency to accomplish a similar improvement in linearity. Aspects of the disclosed amplifier may provide 20% to 30% higher PAE for given power and chip size, for example, as illustrated by the PAE curve 326. Plot 320 illustrates qualitatively that the PAE 326 for an amplifier of the present disclosure may be larger than the PAE 301 of a conventional amplifier, such that the disclosed amplifier exhibits over 40% PAE at P3 dB (point 322 in plot 320), as illustrated by arrow 328.

As shown in plot 320, backing off an input power to the disclosed amplifier (e.g., power backoff by approximately 7 dB, illustrated by the separation between lines 325 and 327) may bring the PAE in the amplifier back to the same value possible with a lower thermal conductivity amplifier (e.g., PAE of about 18%) while having an improved $P_1$/IMP3 ratio (e.g., 30 dB shown with point 323). The input power that delivers P3 dB output power may be illustrated with the vertical line 325, while the backed off power that results in the selected $P_1^{LIN}$ (e.g., and kept equal to the value illustrated in plot 300) may be shown with vertical dashed line 327. In some aspects, the amplifier continues to exhibit improved linearity over a conventional amplifier operating at the same PAE, despite the amplifier having a larger input power back-off This difference may be illustrated, for example, by arrow 329.

Values of output powers, P3 dB levels, and IMP3 levels and ratios are used as an illustration for the purpose of explanation in the present disclosure. Actual values may differ from the values used herein and aspects of the example amplifier described herein may vary based upon application. As shown in the illustrated examples, although back-off may improve linearity, it may also reduce energy efficiency. In some aspects, the disclosed amplifier (e.g., comprising chip 100B) may provide a smaller reduction in efficiency compared to a conventional amplifier that is backed off by a similar (or the same) amount of power. The efficiency of linear amplifiers (e.g., class A, AB, B) may depend on the amplitude of the output signal.

In some examples, linear amplifiers may use power supplies to provide constant voltage to an amplifier. The output power (e.g., of the linear amplifier) may vary slowly with input power $P_{IN}$. In some cases, DC power consumption may be independent of an input signal, or at least close to independent. Therefore, the efficiency becomes approximately proportional to the amplitude of the output signal (e.g., the square-root of the output RF power). The target linear output power $P_1^{LIN}$ may be set by a target PFD limit. In some cases, a conventional amplifier may have a high enough P3 dB such that a back-off may result in better linearity, but at a cost of a significant reduction in PAE. Conversely, a conventional amplifier may have a low enough P3 dB such that back-off may result in higher PAE, but a cost of decreased linearity. Aspects of the present disclosure provide effective linearity while maintaining high PAE.

Table 1 below illustrates certain characteristics of an example microwave amplifier, according to the disclosed aspects, in comparison to certain characteristics of a conventional microwave amplifier. In some aspects, the example microwave amplifier comprises a GaND chip (e.g., chip 100B) and the conventional amplifier comprises GaN-on-SiC chip. The conventional amplifier may be a commercially-available amplifier for use in a K-band frequency range (e.g., Ku-band, 17-20 GHz) and capable of providing, for example, at least 10 W of output power. Table 1 illustrates how the disclosed aspects of the example amplifier can provide improved thermal management, higher efficiency and more output power.

TABLE 1

| Parameter | GaN-on-SiC amplifier | GaN-on-diamond amplifier |
| --- | --- | --- |
| Form factor | Bare chip 2.8 × 2.95 mm² | Bare chip 2.8 × 3 mm² |
| Frequency (GHz) | 17-20 | 17.3-20.3 |
| Lithography node | 150 nm gate | 150 nm gate |
| P3dB | 40 dBm (10 W) | 41.1 dBm (16 W) |
| CW PAE @ P3dB | 30% | 42% |
| Gain ($S_{21}$) | 30 dB | 25 dB |
| $T_{CH}$ | 240° C. | 132° C. |

A wireless communication system (e.g., comprising a wireless communication link) may be characterized by a link budget, and a link budget may be characterized by a computation of a signal-to-noise ratio achievable at a receiver (e.g., station, ground station, Earth station) given possible system parameters and environmental impairments. Link budgets may comprise many device parameters, however, for practical concerns, it may be possible to use a simplified approach where the signal propagation may be accounted for using one or a few parameters for each phenomenon or component contribution. In some examples, a link budget may comprise at least two parameters of a wireless communication channel from a transmitting device to a receiving device. Link parameters may comprise power loss along the channel and noise accumulation. In some examples, a link budget may assume that an electromagnetic signal arriving at an antenna of a receiving device may comprise noiseless signal carrying information and noise.

A wireless communication system link may be characterized, at least in part, by a signal-to-noise ratio (SNR). In some examples, a wireless communication system link may be linear, and in such examples, a signal to noise ratio may be comprise signal power divided by noise power. A link budget may comprise signal power, noise power, or both. In some examples, the link budget may comprise gain values and attenuation values of devices that comprise the wireless link. The link budget may be expressed, for example, as a received signal power being equal to a sum of a transmitter power, transmitter antenna gain, receiver antenna gain, path loss, transmission loss, and other factors. In some aspects, a transmitting device that is communicatively coupled to one or more antennas may transmit a signal (e.g., modulated carrier), comprising a transmit power $P_{TX}$, to the one or more antennas. An antenna (e.g., transmit antenna) or an antenna element, such as in an antenna array, may be configured to radiate a focused beam of electromagnetic energy in a specific direction. An antenna with 100% efficiency may radiate received power in one direction as shown in a sample radiation pattern in FIG. 4.

Figure 4:
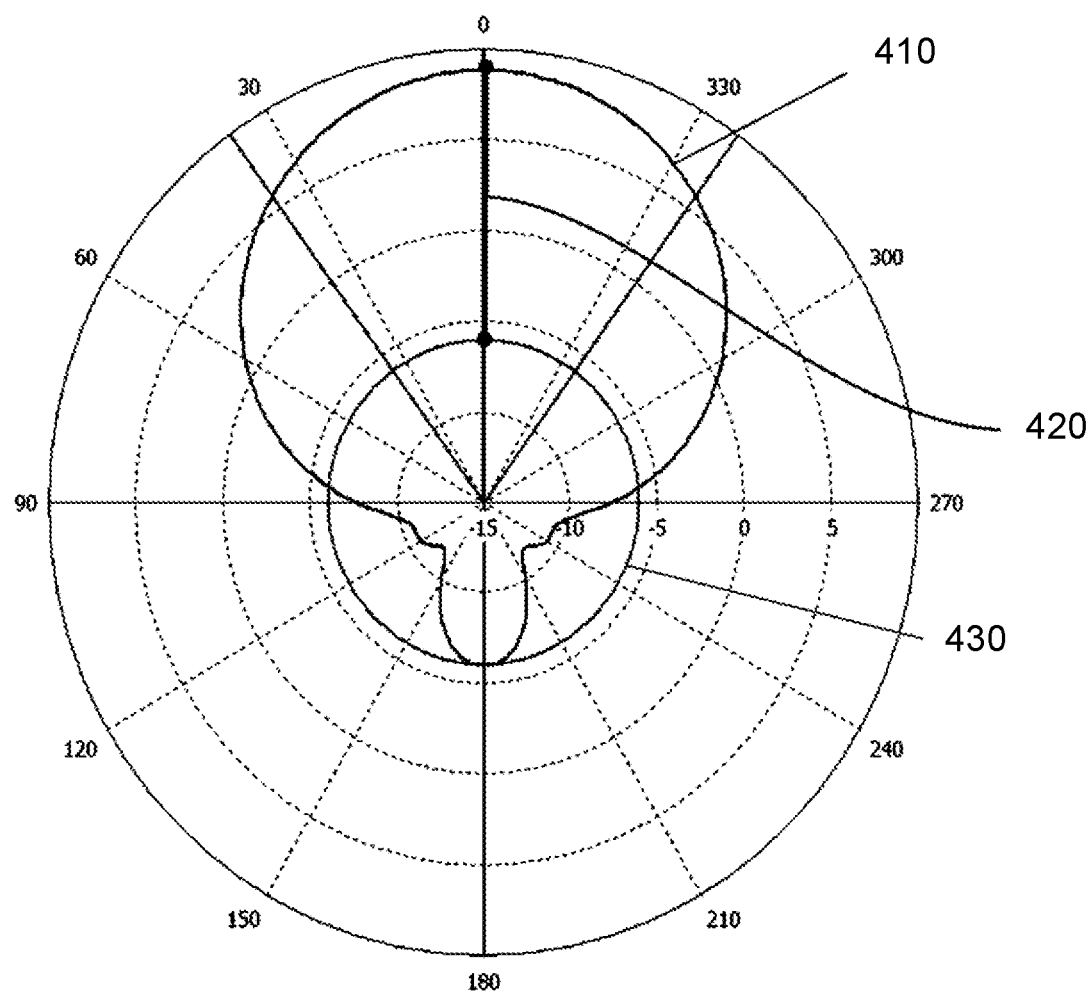
FIG. 4 illustrates a radiation pattern of an example antenna, in accordance with some aspects.

FIG. 4 illustrates a radiation pattern 400 of an example antenna, in accordance with some aspects. In some aspects, FIG. 4 illustrates a pattern of radiation intensity as a function of angle for a directional antenna, e.g., 410. FIG. 4 also illustrates a pattern of radiation intensity of an equivalent power isotropic radiator, e.g., 430. FIG. 4 also illustrates an antenna gain, e.g., 420. Line 410 illustrates intensity versus direction (in dB), which may be proportional to the distance from the origin to the line. Line 430 illustrates intensity for an isotropic radiator. In some aspects, the total power emitted as illustrated by line 430 may be equivalent to the power illustrated by line 410. Antenna gain (G) may be illustrated by the length of line 420, expressed in dB, and the ratio of the intensity in the main lobe divided by the isotropic intensity may be equivalent to the length of the line 420. FIG. 4 may illustrate that the largest amount of radiation (e.g., highest emission) may be in the zero angle direction, however, radiation may also occur to any side. In one example, the power density may be estimated by assuming a uniform radiation pattern (e.g., opposed to a single-lobed radiation pattern).

Assuming a uniform distribution (e.g., approximately equal intensity in all directions), the power density P'[W/m²] at a distance r may be equal to $$P' = \frac{EIRP}{4\pi r^2},$$

where EIRP is the Effective Isotropic Radiative Power [W] given as EIRP=$P_{TX} \cdot G_{TX}$, and where $G_{TX}$ is the transmitter antenna gain. Antenna gain may be expressed as a ratio of the intensity at zero angle (e.g., shown as the tip of line 420) to the intensity of an isotropic radiator emitting equal total power (e.g., shown in line 430).

A transmitter may transmit an electromagnetic signal that propagates in a particular direction. At any distance r, a power density measured in a plane that is perpendicular to the direction of propagation may be obtained from $$P' = \frac{EIRP}{4\pi r^2} [W/m^2].$$

An electromagnetic wave propagating towards Earth may traverse a distance (e.g., more than 500 km) and may eventually reach the atmosphere where some of the power may be absorbed by the atmosphere and/or rain. In addition, the polarization of the wave may be turned randomly. In some cases, an antenna may generally emit waves of one polarization and receive one polarization. In such cases, if the polarization is rotated during propagation, the match to the receiver may not be as efficient and may manifest as loss. One may use γ(gamma) to indicate the fraction of power of an electromagnetic signal that may reach the receiver (e.g., a portion of the signal that was not attenuated). At the surface of the Earth, the power density may be $$P'_E = \gamma \cdot \frac{EIRP}{4\pi r^2} [W/m^2].$$

In some aspects, a receiver antenna (e.g., antenna communicatively coupled to a receiving device) may have an effective aperture area ($A_R$). The power received $P_R$ may be equal to the product of the effective receiver antenna aperture multiplied by the power density of an electromagnetic signal incident on the antenna (e.g., aperture), for example, according to $P_R = A_R \cdot P'[W]$. The power received at the receiver (e.g., at a receiver antenna) may be given by $P_R = \lambda^2 G_{RX}/4\pi \cdot \gamma \cdot EIRP/4\pi r^2 [W]$, where $A_R = \lambda^2 G_{RX}/4\pi$. Alternatively, the power received may be given by as $P_R = G_{RX} \cdot G_{TX} \cdot P_{TX} (\lambda/4\pi r)^2 \cdot \gamma [W]$. The term $(\lambda/4\pi r)^2$ may be referred to as free space loss, and the γ term may be broken down into at least absorption, polarization loss and rain absorption.

In some examples, an estimate of noise power may be an estimate of how much noise will be captured by an antenna (e.g., receiver antenna). In some cases, an estimate of the noise may include thermal noise with power spectral density PSD=kT, [W/Hz], where T is the temperature of the source and k is the Boltzmann constant. In some cases, the noise power may be expressed as a noise temperature. The PSD and the noise temperature may be linearly proportional to each other with a constant. The noise temperature may include a space temperature related to background radiation in space. The space temperature may depend on the received frequency. In some cases, the space temperature of the antenna may be at least 2.7K. In some cases, the space temperature may be about 100 K. The noise temperature may include contributions from a combination of stars and radiation reflected from the atmosphere. The noise temperature may also include contributions from the noise of the amplifiers and waveguide losses in the receiving system. In some examples, a system temperature $T_{SYS}$, which may depend on any one or more of noise power, noise temperature, or space temperature, may be about 290 K. In some examples, the SNR may also depend on the receiver bandwidth B [Hz]. A receiver bandwidth (e.g., and a transmitter bandwidth) may be factors in determining the rate at which data can be transmitted. The SNR may comprise a received signal power divided by total noise received by the system:

$$SNR = \frac{P_{RX}}{kTB}.$$

The noise power may be calculated using kTB, where k is Boltzmann's constant, T is the temperature in Kelvin, and B is the bandwidth. The roll-off factor may describe the steepness of the bandwidth function with frequency. When a digital signal is modulated for transmission (e.g., by a transmitting device), the modulated signal may be a sine waveform with effectively infinite bandwidth. A raised cosine roll-off filter may be applied in order to reduce the occupied bandwidth of the signal. Roll-off may be a measure of spectral efficiency, e.g. how much data can be fit into a particular bandwidth. One example of a satellite signal bandwidth may be at least about 1200 megahertz (MHz). Applying a filter with a roll-off of 0.1 may reduce this bandwidth to 1091 Msym/second. A roll-off factor may be 0.35. In some examples, the roll-off factor may range from 0.2 to 0.4. In some examples the roll-off factor may be greater than 0.1. In some examples, the modulation scheme may be 128 APSK, which uses 7 bits per symbol. In some cases, the symbol rate may be the transmission bit rate divided by 7.

In some examples, the noise power may increase with the instantaneous (e.g., analog) bandwidth B [Hz] and number of bits of information that can be transmitted per second may increase with B. A modulation code can be characterized by spectral efficiency $\eta_s$ given in bits/s/Hz. Using this characterization, if a system is built with analog bandwidth B [Hz] and uses a specific modulation scheme with $\eta_s$, an estimated bitrate $\eta_s \cdot B$ [bits/s] may be greater than 4 Gbps. A maximum information transfer rate may be generally referred to as a channel capacity C [bits/s] and may be given by the Shannon-Hartley theorem expressed as C=B log$_2$ (1+S/N), where S/N is the ratio of signal to noise power. Channel capacity, C, may comprise an upper limit for error-free, or nearly error free, information transfer in the presence of noise defined through the S/N ratio.

EXAMPLES

One example of a satellite communication system includes at least a satellite and a receiver. The altitude of the satellite is 500 km. In other examples, the altitude may be between 400 and 600 km. The signal transmission frequency is in the Ka-band and is 18.3 Ghz. In other examples, the signal transmission frequency may be between 18.3 and 20.2 GHz. The satellite transmitter has an RF power of 10 W. In other examples, the transmitter may have a power of 20 or 50 W. The noise power ratio of the transmitter is 30 dB. In other examples, the noise power ratio may be between 15 dB and 30 dB. The cross-polarization isolation (XPI) is 22 dB. The antenna diameter is 0.5 m, but other examples may use smaller antennas (e.g., antennas having diameters of 0.45-1.2 meters in diameter) or larger antennas (e.g., 2 to 5 meters in diameter). The antenna efficiency is 0.45. The calculated antenna gain is 36.16 dBi (e.g., using the efficiency, the diameter of the antenna, and the wavelength of the transmitted signal). The pointing error is 1.0 degrees. For these values, the transmitter transmits with an EIRP of 43.88 dBW.

Multiple factors contribute to signal attenuation, or propagation loss. The elevation angle is 20 degrees. In other examples, the elevation angle may be a value from a range of 15 to 25 degrees. The path length is 1193 km. The free space path loss, calculated from the path length and signal wavelength, is 179.22 dB). Atmospheric gas losses are 1.5 dB, and may range from 0-10 dB. The expected loss due to rain fade is 20 dB. The total propagation loss is the sum of the free space path loss and the environmental losses (e.g., atmospheric gas losses and rain fade) and is equal to 200.72 dB. The gain at the receiver contributes to the strength of the signal and is dependent on the geometry of the receiver antenna. The diameter of the receiver antenna is 13.2 meters. In other examples, the antenna diameter may range from 10-20 meters. In this example, the efficiency of the antenna is 0.6. The gain, calculated using the efficiency, the signal wavelength, and the diameter of the antenna, is 65.84 dBi.

The receiver also cause signal loss. The pointing loss at the receiver is 0.2 dB. The XPI loss is 25 dB. The temperature of the antenna is 75 K. The receiver low noise amplifier (LNA) noise figure is 2 dB. The LNA noise effective temperature, calculated using the noise figure, is 169.62 K. The feeder operating temperature is 300 K. The feeder and input filter loss is 1 dB. The effective system noise temperature is 290.90 K, calculated using the noise effective temperature, feeder operating temperature, feeder loss, and antenna temperature. Including such factors, the receiver gain over temperature is 40.01 dB/K. The satellite is allocated a bandwidth of 1200 MHz. The roll-off factor for the transmitter is 0.1. The roll-off factor may be between 0 and 0.4. The symbol rate, calculated from the allocated bandwidth and roll-off factor, is 1090.91 Msym/sec. Using a modulation scheme of 128 APSK, the symbol rate corresponds to 7 bits per symbol. The code rate is 0.8. The overhead is 0.1. The sums of the gains and losses at the transmitter and receiver total −102.2 dB. The carrier signal is equal to this sum added to the transmitter power of 10 dBW, totaling −92.2 dBW. The noise signal is calculated from the noise temperature and the symbol rate, and equals −113.58 dBW. The calculated CNR is 21.39 dB. When losses due to XPI and noise power ratio are added, the CNR becomes 17.51 dB. The Shannon capacity, calculated using the bandwidth and the CNR is 7.01 Gbps. With coding and overhead factored in, this reduces to 5.05 Gbps. The dB factor away from Shannon is 3 dB. The data rate is 5.84 Gbps, and is calculated using the bandwidth and the C/N factor (e.g., CNR) minus the dB factor in linear space. Accounting for coding and overhead, the data rate is 4.21 Gbps.

Another example of a satellite communication system includes, at least, a satellite and a receiver. The altitude of the satellite is 500 km. In other examples, the altitude may be between 400 and 600 km. The signal transmission frequency is 42 GHz. The satellite transmitter has an RF power of 5 W. In other examples, the transmitter may have a power of 10, 20, or 50 W. The noise power ratio of the transmitter is 15 dB. In other examples, the noise power ratio may be between 15 dB and 30 dB. The cross-polarization isolation (XPI) is 22 dB. The antenna diameter is 0.5 m, but other examples may use small antennas (e.g., 0.45-1.2 meters in diameter) or larger antennas (e.g., 2 to 5 meters in diameter). The antenna efficiency is 0.45. The calculated antenna gain is 43.4 dBi (e.g., using the efficiency, the diameter of the antenna, and the wavelength of the transmitted signal). The pointing error is 1.0 degrees. For these values, the transmitter transmits with an EIRP of 47.37 dBW.

Multiple factors contribute to signal attenuation, or propagation loss. The elevation angle is 20 degrees. In other examples, the elevation angle may be a value from a range of 15 to 25 degrees. The path length is 1193 km. The free space path loss, calculated from the path length and signal wavelength, is 86.44 dB). Atmospheric gas losses are 1.5 dB, and may range from 0-10 dB. The expected loss due to rain fade is 20 dB. The total propagation loss is the sum of the free space path loss and the environmental losses (e.g., atmospheric gas losses and rain fade) and is equal to 212.94 dB. The gain at the receiver contributes to the strength of the signal and is dependent on the geometry of the receiver antenna. The diameter of the receiver antenna is 12 meters. In other examples, the antenna diameter may range from 10-20 meters. In this example, the efficiency of the antenna is 0.6. The gain, calculated using the efficiency, the signal wavelength, and the diameter of the antenna, is 72.23 dBi.

The receiver may also cause signal loss. The pointing loss at the receiver is 0.2 dB. The XPI loss is 25 dB. The temperature of the antenna is 75 K. The receiver low noise amplifier (LNA) noise figure is 2 dB. The LNA noise effective temperature, calculated using the noise figure, is 169.62 K. The feeder operating temperature is 300 K. The feeder and input filter loss is 1 dB. The effective system noise temperature is 290.90 K, calculated using the noise effective temperature, feeder operating temperature, feeder loss, and antenna temperature. Including these factors, the receiver gain over temperature is 46.39 dB/K.

The satellite is allocated a bandwidth of 2000 MHz. The roll-off factor for the transmitter is 0.1. The roll-off factor may be between 0 and 0.4. The symbol rate, calculated from the allocated bandwidth and roll-off factor, is 1818.18 Msym/sec. For a modulation scheme using 128 APSK, this symbol rate corresponds to 7 bits per symbol. The code rate is 0.8. The overhead is 0.1. The sums of the gains and losses at the transmitter and receiver total −101.53 dB. The carrier signal is equal to this sum added to the transmitter power of 10 dBW, totaling −94.54 dBW. The noise signal is calculated from the noise temperature and the symbol rate, and equals −111.37 dBW. The calculated CNR is 16.82 dB. When losses due to XPI and noise power ratio are added, the CNR becomes 16.82 dB. The Shannon capacity, calculated using the bandwidth and the CNR, is 8.2 Gbps. With coding and overhead factored in, this reduces to 5.91 Gbps. The dB factor away from Shannon is 3 dB. The data rate is 6.37 Gbps, and is calculated using the bandwidth and the C/N factor (e.g., CNR) minus the dB factor in linear space. Accounting for coding and overhead, the data rate is 4.59 GBps.

Another example of a satellite communication system includes at least a satellite and a receiver. The altitude of the satellite is 6000 km. In other examples, the altitude may be between 5000 and 7000 km. The signal transmission frequency is 42 GHz. The satellite transmitter has an RF power of 5 W, or 6.99 dBW. In other examples, the transmitter may have a power of 10, 20, or 50 W. The noise power ratio of the transmitter is 30 dB. In other examples, the noise power ratio may be between 15 dB and 30 dB. The cross-polarization isolation (XPI) is 22 dB. The antenna diameter is 0.5 m, but other examples may use small antennas (e.g., 0.45-1.2 meters in diameter) or larger antennas (e.g., 2 to 5 meters in diameter). The antenna efficiency is 0.45. The calculated antenna gain is 43.4 dBi (e.g., using the efficiency, the diameter of the antenna, and the wavelength of the trans-mitted signal). The pointing error is 1.0 degrees. For these values, the transmitter transmits with an EIRP of 47.37 dBW.

Multiple factors contribute to signal attenuation, or propagation loss. The elevation angle is 20 degrees. In other examples, the elevation angle may be a value from a range of 15 to 25 degrees. The path length is 1193 km. The free space path loss, calculated from the path length and signal wavelength, is 86.44 dB. Atmospheric gas losses are 1.5 dB and may range from 0-10 dB. The expected loss due to rain fade is 25 dB, assuming heavy rain. The total propagation loss is the sum of the free space path loss and the environmental losses (e.g., atmospheric gas losses and rain fade) and is equal to 230.15 dB. The gain at the receiver contributes to the strength of the signal and is dependent on the geometry of the receiver antenna. The diameter of the receiver antenna is 12 meters. In other examples, the antenna diameter may range from 10-20 meters. In this example, the efficiency of the antenna is 0.6. The gain, calculated using the efficiency, the signal wavelength, and the diameter of the antenna, is 72.23 dBi.

The receiver may also cause signal loss. The pointing loss at the receiver is 0.2 dB. The XPI loss is 25 dB. The temperature of the antenna is 75 K. The receiver low noise amplifier (LNA) noise figure is 2 dB. The LNA noise effective temperature, calculated using the noise figure, is 169.62 K. The feeder operating temperature is 300 K. The feeder and input filter loss combined is 1 dB. The effective system noise temperature is 290.90 K, calculated using the noise effective temperature, feeder operating temperature, feeder loss, and antenna temperature. Including these factors, the receiver gain over temperature is 46.39 dB/K.

The satellite is allocated a bandwidth of 250 MHz. The roll-off factor for the transmitter is 0.1. The roll-off factor may be between 0 and 0.4. The symbol rate, calculated from the allocated bandwidth and roll-off factor, is 227.27 Msym/sec. For a modulation scheme using 128 APSK, such symbol rate corresponds to 7 bits per symbol. The code rate is 0.8. The overhead is 0.1. The sums of the gains and losses at the transmitter and receiver total −118.74 dB. The carrier signal is equal to this sum added to the transmitter power of 10 dBW, totaling −111.75 dBW. The noise signal is calculated from the noise temperature and the symbol rate and equals −120.40 dBW. The calculated CNR is 8.65 dB. When losses due to XPI and noise power ratio are added, the CNR becomes 8.33 dB. The Shannon capacity, calculated using the bandwidth and the CNR, is 0.74 Gbps. With coding and overhead factored in, this reduces to 0.53 Gbps. The dB factor away from Shannon is 3 dB. The data rate is 0.54 Gbps and is calculated using the bandwidth and the C/N factor (e.g., CNR) minus the dB factor in linear space. Accounting for coding and overhead, the data rate is 0.39 Gbps.

Another example of a satellite communication system includes at least a satellite and a receiver. The altitude of the satellite is 6000 km. In other examples, the altitude may be between 5000 and 7000 km. The signal transmission frequency is Ka-band and is a frequency within a range from 17.7-20.2 GHz. The satellite transmitter has an RF power of 300 W. In other examples, the transmitter may have a power between 200-400 W. The noise power ratio of the transmitter is 15 dB. In other examples, the noise power ratio may be between 15 dB and 30 dB. The cross-polarization discrimination (XPD) is greater than 15 dB. The calculated antenna gain is 40 dBi (e.g., using the efficiency, the diameter of the antenna, and the wavelength of the transmitted signal). In other examples, the antenna gain can be between 38-42 dBi.

The satellite is allocated a bandwidth of 20 GHz. Total capacity of the satellite communication system is at least about 50 Gbps.

Another example of a satellite communication system includes at least a satellite and a receiver. The altitude of the satellite may be about 6000 km. In other examples, the altitude may be between 5000 and 7000 km. In other examples, the altitude of the satellite may be about 500 km or between 400 and 600 km. The signal transmission frequency is E-band and is a frequency within a range from about 71 GHz to about 76 GHz. The satellite transmitter has an RF power of about 40 W. The noise power ratio of the transmitter is about 15 dB. The cross-polarization discrimination (XPD) is about 18 dB.

Example 1 is a chip for transmitting or receiving data, comprising: a first substrate comprising a first material; and a second substrate adjacent to said first substrate, which second substrate comprises a second material that is different than said first material, wherein said second substrate is lattice-matched to said first substrate such that an interface region between said first substrate and said second substrate exhibits an sp3 carbon peak at about 1332 cm$^{-1}$ having a full width half maximum of no more than 5.0 cm$^{-1}$ as measured by Raman spectroscopy, wherein said first substrate and said second substrate permit said chip to transmit or receive said data at a transfer rate of at least 500 megabits per second and a frequency of at least 8 GHz.

In Example 2, the subject matter of Example 1 includes, wherein said chip comprises a radiofrequency amplifier circuit.

In Example 3, the subject matter of Example 1 includes, wherein said first substrate has a thermal conductivity greater than about 1000 W/mK.

In Example 4, the subject matter of Example 3 includes, wherein said first substrate comprises diamond.

In Example 5, the subject matter of Example 1 includes, wherein said second substrate is a semiconductor.

In Example 6, the subject matter of Example 5 includes, wherein said second substrate comprises a group III-V semiconductor.

In Example 7, the subject matter of Example 6 includes, wherein said second substrate comprises a material selected from the group consisting of GaN, InGaN, AlGaN, and InGaAlN.

In Example 8, the subject matter of Example 5 includes, wherein said second substrate comprises silicon.

In Example 9, the subject matter of Example 1 includes, wherein said interface region exhibits an sp2 carbon peak at 1550 cm$^{-1}$ having an amplitude which is no more than 20% of a height of said sp3 carbon peak after background subtraction, as measured by Raman spectroscopy.

In Example 10, the subject matter of Example 9 includes, wherein said interface region exhibits said sp3 carbon peak which is greater or equal to 10% of a local background intensity.

In Example 11, the subject matter of Example 1 includes, wherein said transfer rate is at least 10 gigabits per second.

In Example 12, the subject matter of Example 1 includes, wherein said transfer rate is at least 12 gigabits per second.

In Example 13, the subject matter of Example 1 includes, wherein said transfer rate is at least 14 gigabits per second.

In Example 14, the subject matter of Example 1 includes, wherein said transfer rate is at least 100 gigabits per second.

In Example 15, the subject matter of Example 1 includes, wherein said transfer rate is at least 1 terabit per second.

In Example 16, the subject matter of Example 1 includes, wherein said frequency is within a range from 37.5 GHz to 300 GHz.

In Example 17, the subject matter of Example 1 includes, wherein said frequency is within a range from 37.5 GHz to 40.5 GHz.

In Example 18, the subject matter of Example 1 includes, wherein said chip comprises a transistor comprising said second substrate.

In Example 19, the subject matter of Example 1 includes, wherein said transistor has a feature size less than 40 nanometers (nm).

In Example 20, the subject matter of Example 1 includes, wherein said frequency has a bandwidth of at least 50 MHz.

Example 21 is a chip for transmitting or receiving data, comprising: a first substrate comprising a first material; and a second substrate adjacent to said first substrate, which second substrate comprises a second material that is different than said first material, wherein said first substrate and said second substrate are lattice-matched such that (i) said chip outputs an effective radiated power within a range from 5 W to 42 W within an antenna gain less than 30 dBi for an input power less than or equal to 2 W in a linear regime, and (ii) said chip transmits or receives said data at a transfer rate of at least 500 megabits per second.

Example 22 is a chip for transmitting or receiving data, comprising: a first substrate comprising a first material; and a second substrate adjacent to said first substrate, which second substrate comprises a second material that is different than said first material, wherein said second substrate is lattice-matched to said first substrate, to provide a thermal conductivity across said first substrate and second substrate greater than or equal to 1000 W/mK, and wherein said first substrate and said second substrate permit said chip to transmit or receive said data at a transfer rate of at least 500 megabits per second and a frequency of at least 8 GHz.

Example 23 is a chip for transmitting or receiving data, comprising: a first substrate comprising a first material; and a second substrate adjacent to said first substrate, which second substrate comprises a second material that is different than said first material, wherein said second substrate is lattice-matched to said first substrate, wherein said first substrate and said second substrate are lattice-matched such that (i) said chip outputs an effective radiated power within a range from 5 W to 42 W with a carrier to noise ratio of greater than 25 dB, and (ii) said chip transmits or receives said data at a transfer rate of at least 500 megabits per second and with a bandwidth within a range of at least 50 MHz.

Example 24 is a chip for transmitting or receiving data, comprising: a first substrate comprising a first material; and a second substrate adjacent to said first substrate, which second substrate comprises a second material that is different than said first material, wherein said second substrate is lattice-matched to said first substrate, wherein said first substrate and said second substrate are lattice-matched such that (i) said chip outputs an effective radiated power within a range from 5 W to 42 W with a noise power interference ratio of less than 20 dB and (ii) said chip transmits or receives said data at a transfer rate of at least 500 megabits per second and a frequency of at least 8 GHz.

Example 25 is a system for transmitting or receiving data, comprising: a chip comprising (i) a first substrate comprising a first material, and (ii) a second substrate adjacent to said first substrate, which second substrate comprises a second material that is different than said first material, wherein said second substrate is lattice-matched to said first substrate such that an interface region between said first substrate and said second substrate exhibits an sp3 carbon peak at about 1332 cm$^{-1}$ having a full width half maximum of no more than 5.0 cm$^{-1}$ as measured by Raman spectroscopy, wherein said first substrate and said second substrate permit said chip to transmit or receive said data at a transfer rate of at least 500 megabits per second and a frequency of at least 8 GHz; and a transmitting or receiving unit operatively coupled to said chip, which transmitting or receiving unit is configured to transmit or receive said data.

In Example 26, the subject matter of Example 25 includes, wherein said chip and said transmitting or receiving unit are part of a satellite.

In Example 27, the subject matter of Example 26 includes, wherein said satellite is a cubesat.

In Example 28, the subject matter of Example 26 includes, wherein said satellite weighs less than 50 kilograms.

In Example 29, the subject matter of Example 26 includes, further comprising one or more additional satellites each comprising said chip and transmitting or receiving unit.

In Example 30, the subject matter of Example 25 includes, wherein said transmitting or receiving unit comprises one or more antennas.

In Example 31, the subject matter of Example 25 includes, wherein said transmitting or receiving unit is configured to transmit or receive said data to a remote transmitting or receiving unit.

In Example 32, the subject matter of Example 25 includes, wherein said data comprises at least one of voice, audio, or video data.

Example 33 is a chip for transmitting data, comprising: a semiconductor layer operatively coupled to a substrate, wherein said substrate has a thermal conductivity greater than about 1000 W/mK, wherein said thermal conductivity enables said chip to produce at least 10 W of output power with an efficiency of at least 40% and a gain of at least 30 dB, for amplifying signals and transmitting said data at a transfer rate of at least 4 gigabits per second and a frequency of at least 18 GHz.

In Example 34, the subject matter of Example 33 includes, wherein said chip comprises a radiofrequency amplifier circuit.

In Example 35, the subject matter of Example 33 includes, wherein said radiofrequency amplifier circuit comprises an integrated microwave circuit or an integrated millimeter-wave circuit.

In Example 36, the subject matter of Example 33 includes, wherein said substrate comprises diamond.

In Example 37, the subject matter of Example 33 includes, wherein said semiconductor layer comprises a group III-V semiconductor selected from the group consisting of GaN, InGaN, AlGaN, and InGaAlN.

In Example 38, the subject matter of Example 33 includes, wherein a level of interference from noise power ratio of said chip is less than or equal to 20 dB.

In Example 39, the subject matter of Example 33 includes, wherein a level of interference from cross-polarization on said chip is less than or equal to 12 dB.

Example 40 is a transmission device for transmitting data, comprising: the chip of Example 33; and a transmitting antenna operatively coupled to said chip, wherein said chip is configured to provide said output power to said transmitting antenna for transmitting said data at said transfer rate and said frequency.

In Example 41, the subject matter of Example 40 includes, wherein said device is a satellite transmitter.

In Example 42, the subject matter of Example 41 includes, wherein said satellite transmitter is configured to transmit said data at an altitude of at least 400 km.

In Example 43, the subject matter of Example 41 includes, wherein said satellite transmitter is configured to transmit said data at an altitude between about 400 km and about 600 km.

In Example 44, the subject matter of Example 41 includes, wherein said transmitting antenna has a diameter less than or equal to 0.5 meters.

In Example 45, the subject matter of Example 40 includes, wherein said transmitting antenna has an efficiency of at least 45%.

In Example 46, the subject matter of Example 40 includes, wherein said transmitting antenna has a gain of at least 36 dBi.

In Example 47, the subject matter of Example 40 includes, wherein said transmission device has a pointing error of less than or equal to 1 degree.

In Example 48, the subject matter of Example 40 includes, wherein said transmission device has a pointing loss of less than 2.3 or equal to dB.

In Example 49, the subject matter of Example 40 includes, wherein said transmission device has an effective isotropic radiative power of at least 43 dBW.

Example 50 is a data communication link comprising: the transmission device of Example 40; and a receiving device in wireless communication with said transmission device, wherein said receiving device is configured to receive said data transmitted from said transmission device.

In Example 51, the subject matter of Example 50 includes, wherein said receiving device comprises a receiving antenna having a gain of at least 65 dBi and an efficiency of at least 60%.

In Example 52, the subject matter of Example 50 includes, wherein an allocated bandwidth per carrier is at least about 1200 MHz.

In Example 53, the subject matter of Example 50 includes, where said link has a noise power of less than or equal to 114 dB.

In Example 54, the subject matter of Example 50 includes, wherein said link has a signal-to-noise ratio of greater than 18 dB.

In Example 55, the subject matter of Example 50 includes, wherein said link has a maximum channel data rate capacity of at least 5 gigabits per second.

In Example 56, the subject matter of Example 50 includes, wherein said link has a spectral efficiency of at least 5 bps/Hz.

In Example 57, the subject matter of Example 51 includes, wherein said receiving antenna of said receiving device has a diameter of at least 12 meters.

In Example 58, the subject matter of Example 51 includes, wherein a power flux density received at said receiving antenna of said receiving device is at least 80 dBW/m$^2$.

In Example 59, the subject matter of Example 50 includes, wherein said link is subject to a propagation loss of at least 200 dB.

In Example 60, the subject matter of Example 33 includes, wherein said signals comprise a modulated carrier signal, and wherein said chip has a reduced signal distortion relative to said modulated carrier signal such that a linearity of said chip is improved.

In Example 61, the subject matter of Example 60 includes, wherein said signal distortion comprises an nth-order intermodulation product.

In Example 62, the subject matter of Example 61 includes, wherein said nth-order intermodulation product comprises a third order intermodulation product or a fifth order intermodulation product.

In Example 63, the subject matter of Example 61 includes, wherein said linearity of said chip is associated with a ratio of (i) an output power of said modulated carrier signal to (ii) a power of said nth-order intermodulation product.

In Example 64, the subject matter of Example 63 includes, wherein said ratio is at least 30 dB.

In Example 65, the subject matter of Example 63 includes, wherein an operating channel temperature of said chip is less than 200° C.

In Example 66, the subject matter of Example 33 includes, wherein said output power corresponds to a maximum output power in a linear operating regime of said chip.

In Example 67, the subject matter of Example 33 includes, wherein said efficiency corresponds to a power added efficiency (PAE) in a linear operating regime of said chip.

In Example 68, the subject matter of Example 33 includes, wherein an input power to said chip is backed off by at least 5 dB from a saturation level into a linear operating regime of said chip.

Example 69 is a chip for transmitting data, comprising: a semiconductor layer operatively coupled to a substrate, wherein said substrate has a thermal conductivity greater than about 1000 W/mK, and wherein said thermal conductivity enables said chip to produce at least 5 W of output power with an efficiency of at least 40% and a gain of at least 30 dB, for amplifying signals and transmitting said data at a transfer rate of at least 300 megabits per second and a frequency of at least 40 GHz.

In Example 70, the subject matter of Example 69 includes, wherein said chip comprises a radiofrequency amplifier circuit.

In Example 71, the subject matter of Example 69 includes, wherein said radiofrequency amplifier circuit comprises an integrated microwave circuit or an integrated millimeter-wave circuit.

In Example 72, the subject matter of Example 69 includes, wherein said substrate comprises diamond.

In Example 73, the subject matter of Example 69 includes, wherein said semiconductor layer comprises a group III-V semiconductor selected from the group consisting of GaN, InGaN, AlGaN, and InGaAlN.

In Example 74, the subject matter of Example 69 includes, wherein a level of interference from noise power ratio of said chip is less than or equal to about 23 dB.

In Example 75, the subject matter of Example 69 includes, wherein a level of interference from cross-polarization on said chip is less than or equal to about 15 dB.

Example 76 is a transmission device for transmitting data, comprising: the chip of Example 69; and a transmitting antenna operatively coupled to said chip, wherein said chip is configured to provide said output power to said transmitting antenna for transmitting said data at said transfer rate and said frequency.

In Example 77, the subject matter of Example 76 includes, wherein said device is a satellite transmitter.

In Example 78, the subject matter of Example 77 includes, wherein said satellite transmitter is configured to transmit said data at an altitude of at least 5000 km.

In Example 79, the subject matter of Example 78 includes, wherein said satellite transmitter is configured to transmit said data at an altitude of 6000 km.

In Example 80, the subject matter of Example 76 includes, wherein said transmitting antenna has a diameter less than or equal to 0.5 meters.

In Example 81, the subject matter of Example 76 includes, wherein said transmitting antenna has an efficiency of at least 45%.

In Example 82, the subject matter of Example 76 includes, wherein said transmitting antenna has a gain of at least 43 dBi.

In Example 83, the subject matter of Example 76 includes, wherein said transmission device has a pointing error of less than or equal to 0.5 degree.

In Example 84, the subject matter of Example 76 includes, wherein said transmission device has a pointing loss of less than or equal to 3 dB.

In Example 85, the subject matter of Example 76 includes, wherein said transmission device has an effective isotropic radiative power of at least 47 dBW.

Example 86 is a data communication link comprising: the transmission device of Example 76; and a receiving device in wireless communication with said transmission device, wherein said receiving device is configured to receive said data transmitted from said transmission device.

In Example 87, the subject matter of Example 86 includes, wherein said receiving device comprises a receiving antenna having a gain of at least 72 dBi and an efficiency of at least 60%.

In Example 88, the subject matter of Example 86 includes, wherein an allocated bandwidth per carrier is at least 250 MHz.

In Example 89, the subject matter of Example 86 includes, where said link has a noise power of less than about 120 dBW.

In Example 90, the subject matter of Example 86 includes, wherein said link has a signal-to-noise ratio of greater than about 8.5 dB.

In Example 91, the subject matter of Example 86 includes, wherein said link has a maximum channel data rate capacity of at least 500 megabits per second.

In Example 92, the subject matter of Example 86 includes, wherein said link has a spectral efficiency of at least 2.9 bps/Hz.

In Example 93, the subject matter of Example 87 includes, wherein said receiving antenna of said receiving device has a diameter of at least 12 meters.

In Example 94, the subject matter of Example 87 includes, wherein a power flux density at said receiving antenna of said receiving device is at least 99 dBW/m$^2$.

In Example 95, the subject matter of Example 86 includes, wherein said link is subject to a propagation loss of at least 200 dB.

In Example 96, the subject matter of Example 76 includes, wherein said signals comprise a modulated carrier signal, and wherein said chip has a reduced signal distortion relative to said modulated carrier signal such that a linearity of said chip is improved.

In Example 97, the subject matter of Example 96 includes, wherein said signal distortion comprises an nth-order intermodulation product.

In Example 98, the subject matter of Example 97 includes, wherein said nth-order intermodulation product comprises a third order intermodulation product or a fifth order intermodulation product.

In Example 99, the subject matter of Example 97 includes, wherein said linearity of said chip is associated with a ratio of (i) an output power of said modulated carrier signal to (ii) a power of said nth-order intermodulation product.

In Example 100, the subject matter of Example 99 includes, wherein said ratio is at least 30 dB.

In Example 101, the subject matter of Example 99 includes, wherein an operating channel temperature of said chip is less than 200° C.

In Example 102, the subject matter of Example 76 includes, wherein said output power corresponds to a maximum output power in a linear operating regime of said chip.

In Example 103, the subject matter of Example 76 includes, wherein said efficiency corresponds to a power added efficiency (PAE) in a linear operating regime of said chip.

In Example 104, the subject matter of Example 76 includes, wherein an input power to said chip is backed off by at least 5 dB from a saturation level into a linear operating regime of said chip.

Example 105 is an apparatus comprising means for performing any of the operations of Examples 1 to 104.

Example 106 is a system to perform the operations of any of Examples 1 to 104.

Example 107 is a method to implement of any of Examples 1-104.

While preferred embodiments of the present disclosure have been shown and described herein, it will be obvious to those skilled in the art that such embodiments are provided by way of example only. It is not intended that the present disclosure be limited by the specific examples provided within the specification. While the present disclosure has been described with reference to the aforementioned specification, the descriptions and illustrations of the embodiments herein are not meant to be construed in a limiting sense. Numerous variations, changes, and substitutions will now occur to those skilled in the art without departing from the present disclosure. Furthermore, it shall be understood that all aspects of the present disclosure are not limited to the specific depictions, configurations or relative proportions set forth herein which depend upon a variety of conditions and variables. It should be understood that various alternatives to the embodiments of the present disclosure described herein may be employed in practicing the present disclosure. It is therefore contemplated that the present disclosure shall also cover any such alternatives, modifications, variations or equivalents. It is intended that the following claims define the scope of the present disclosure and that methods and structures within the scope of these claims and their equivalents be covered thereby.

What is claimed is:

1. A device for transmitting or receiving signals, comprising:
    a layered structure comprising a first material; and
    a substrate adjacent to said layered structure, which substrate comprises a second material that is different than said first material, wherein said second material has an average value of thermal conductivity greater than or equal to about 1,000 Watts per meter Kelvin (W/mK), and
    wherein said layered structure and said substrate are configured to permit said device to amplify said signals and generate an output power of at least about 0.1 nano Watts (nW).

2. The device of claim 1, wherein said output power is a peak power output.

3. The device of claim 1, wherein said output power is from about 2 Watts (W) to about 1.5 kilo Watts (kW).

4. The device of claim 1, wherein said output power is from about 1 Watt (W) to about 120 Watts (W).

5. The device of claim 1, wherein said output power is from about 0.1 nano Watts (nW) to about 15 Watts (W).

6. The device of claim 1, wherein said layered structure and said substrate are configured to permit said device to transmit or receive said signals having a bandwidth of at least about 10 mega Hertz (MHz) at a threshold frequency.

7. The device of claim 6, wherein said threshold frequency is at least about 500 mega Hertz (MHz).

8. The device of claim 1, wherein said layered structure and said substrate are configured to permit said device to transmit or receive said signals at an average transfer rate of at least about 100 megabits per second.

9. The device of claim 1, wherein said layered structure and said substrate are configured to permit said device to generate said output power at a power added efficiency (PAE) of at least about 2%.

10. The device of claim 9, wherein said PAE is from about 40% to about 75%.

11. The device of claim 9, wherein said PAE is from about 25% to about 56%.

12. The device of claim 9, wherein said PAE is from about 2% to about 35%.

13. The device of claim 1, wherein said second material exhibits an sp3 carbon peak at about 1332 wavenumbers (cm$^{-1}$) having a full width half maximum less than or equal to about 5.0 cm$^{-1}$ as measured by Raman spectroscopy.

14. The device of claim 13, wherein an interface region between said layered structure and said substrate exhibits an sp2 carbon peak at 1550 per centimeter (cm$^{-1}$) having an amplitude less than or equal to about 20% of a height of said sp3 carbon peak after background subtraction, as measured by Raman spectroscopy.

15. The device of claim 13, wherein said second material exhibits said sp3 carbon peak which is equal to or greater than about 10% of a local background intensity.

16. The device of claim 1, further comprising a radio frequency amplifier circuit.

17. The device of claim 1, wherein said second material comprises diamond.

18. The device of claim 1, wherein said first material comprises a semiconductor.

19. The device of claim 18, wherein said semiconductor is a wide-bandgap semiconductor.

20. The device of claim 18, wherein said semiconductor comprises silicon.

21. The device of claim 1, wherein said layered structure comprises a material selected from the group consisting of GaN, AlN, InGaN, InAlN, AlGaN, InGaAlN, Ga2O3, ScAlN, and derivatives or combinations of thereof.

22. The device of claim 1, wherein said first material comprises gallium and nitrogen.

23. The device of claim 1, further comprising a transistor that comprises said layered structure.

24. The device of claim 23, wherein said transistor is a high-electron mobility transistor.

25. The device of claim 1, wherein said layered structure is operably coupled to said substrate.

* * * * *